(12) United States Patent
Yumoto et al.

(10) Patent No.: US 8,136,480 B2
(45) Date of Patent: Mar. 20, 2012

(54) PHYSICAL VAPOR DEPOSITION SYSTEM

(75) Inventors: Atsushi Yumoto, Tokyo (JP); Naotake Niwa, Tokyo (JP); Fujio Hiroki, Tokyo (JP); Ichiro Shiota, Tokyo (JP); Takahisa Yamamoto, Chiba (JP)

(73) Assignee: Tama-Tlo, Ltd., Tokyo (JP)

( * ) Notice: Subject to any disclaimer, the term of this patent is extended or adjusted under 35 U.S.C. 154(b) by 1032 days.

(21) Appl. No.: 11/577,305

(22) PCT Filed: Oct. 14, 2005

(86) PCT No.: PCT/JP2005/018964
§ 371 (c)(1),
(2), (4) Date: Feb. 22, 2008

(87) PCT Pub. No.: WO2006/041160
PCT Pub. Date: Apr. 20, 2006

(65) Prior Publication Data
US 2008/0257723 A1    Oct. 23, 2008

(30) Foreign Application Priority Data

Oct. 14, 2004    (JP) ................................ 2004-300122

(51) Int. Cl.
*C23C 16/00* (2006.01)
*C23C 16/50* (2006.01)

(52) U.S. Cl. .............. 118/723 R; 118/723 EB; 118/719; 118/726

(58) Field of Classification Search .................. None
See application file for complete search history.

(56) References Cited

U.S. PATENT DOCUMENTS 3,706,652 A * 12/1972 Hamblyn et al. ........ 422/186.01

(Continued)

FOREIGN PATENT DOCUMENTS

JP    63-030181    2/1988

(Continued)

OTHER PUBLICATIONS

A. Yumoto, F. Hiroki, I. Shiota, N. Niwa; "In situ synthesis of titanium-alumindes in coating with supersonic free-jet PVD using Ti and Al nanoparticles." Jun. 2, 2003, Surface and Coatings Technology, vol. 169-170, pp. 499-503.*

(Continued)

*Primary Examiner* — Dah-Wei Yuan
*Assistant Examiner* — Binu Thomas
(74) *Attorney, Agent, or Firm* — Knobbe Martens Olson & Bear LLP

(57) ABSTRACT

A physical vapor deposition system for making microparticles generated by using a non-transfer type plasma torch not generating an outgas even in an ultra-high vacuum environment accelerate by a supersonic gas flow and depositing microparticles on a substrate to form a coating film is provided. Provision is made of an evaporation chamber (10, 20) having a plasma torch (16, 26) and an evaporation source (15, 25) inside it and a film formation chamber 30 having a supersonic nozzle 35 and a substrate for film formation 33. Each plasma torch has a substantially cylindrical electrically conductive anode 40, a polymer-based or non-polymer-based insulation pipe 50 inserted to the inner side of that and generating less outgas than a phenol resin, and a rod shaped cathode 60 inserted to the inner side of an insulation pipe 50. Microparticles are generated from an evaporation source (15, 25) by a plasma obtained by applying voltages to the anode 40 and the cathode 60, ejected from a supersonic nozzle 35, made to ride on a supersonic gas flow, and deposited by physical vapor deposition onto a substrate for film formation 33.

14 Claims, 12 Drawing Sheets

U.S. PATENT DOCUMENTS

| | | | | |
|---|---|---|---|---|
| 4,322,384 | A | * | 3/1982 | Sutton .......................... 422/144 |
| 6,215,090 | B1 | * | 4/2001 | Severance et al. ....... 219/121.48 |

FOREIGN PATENT DOCUMENTS

| | | |
|---|---|---|
| JP | 2-16379 | 4/1993 |
| JP | 5-164113 | 6/1993 |
| JP | 06-039276 | 5/1994 |
| JP | 07-185823 | 7/1995 |
| JP | 2000-017427 | 1/2000 |
| JP | 2000-212751 | 8/2000 |
| JP | 2004-263266 | 9/2004 |

OTHER PUBLICATIONS

S.J. Wang, S. Devahastin, A.S. Mujumdar; "Effect of temperature difference on flow and mixing characteristics of laminar confined opposing jets." Sep. 12, 2005, Applied Thermal Engineering, vol. 26, pp. 519-529.*

Official Action dated Feb. 8, 2011 from the Japanese Patent Office in corresponding Japanese Patent Application No. 2004-300122.

Atsushi Yumoto, et al., "Formation of Titanium and Aluminum Films by Supersonic Free-Jet PVD Method", *Japan Institute of Metals*. vol. 65, No. 7, p. 635-643 (2001).

Keijiro Yamamoto, et al., "Oscillatory Phenomena in Coaxial Impingement of Opposing Jets", *Journal of the Japan Hydraulics & Pneumatics Society*. vol. 6, No. 2, p. 68-77 (1975).

A. Yumoto, et al., "In situ synthesis of titanium-aluminides in coating with supersonic free-jet PVD using Ti and Al nanoparticles", *Surface and Coatings Technology*. 169-170, 2003, 499-503.

International Search Report for PCT/JP2005/018964 dated Nov. 2, 2005.

* cited by examiner

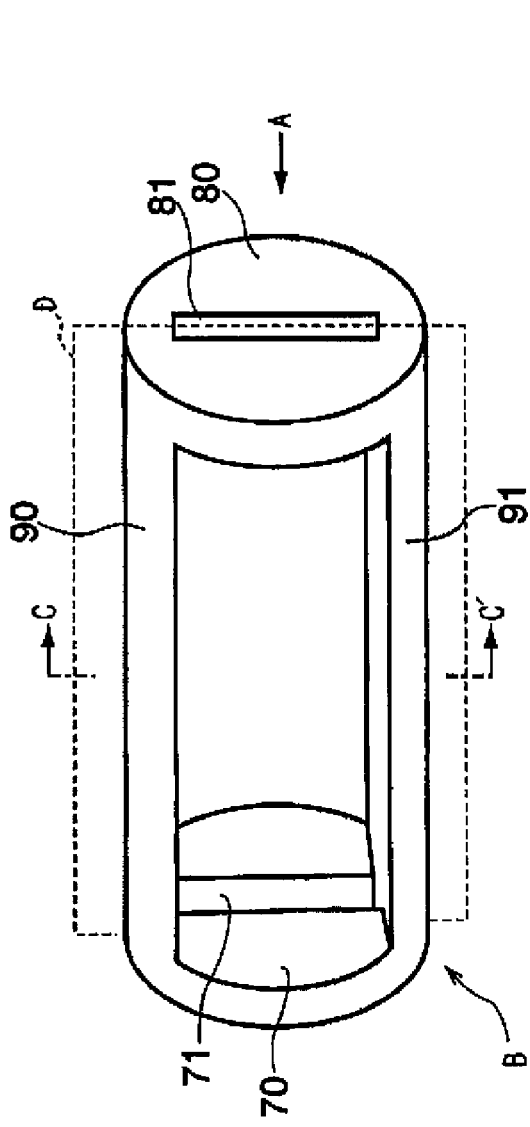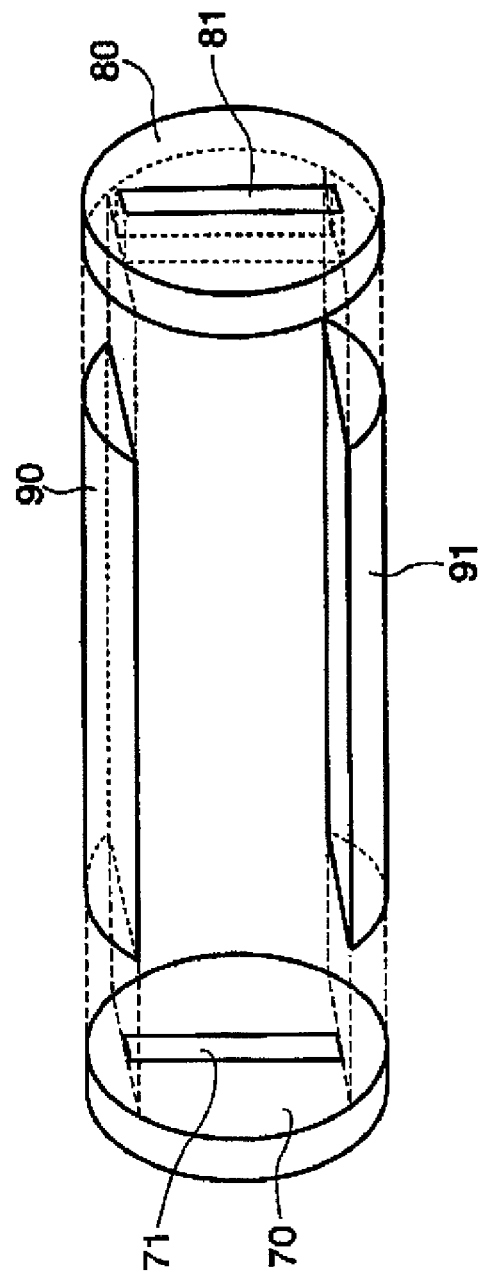
FIG. 7A
FIG. 7B

PHYSICAL VAPOR DEPOSITION SYSTEM

CROSS REFERENCE TO RELATED APPLICATIONS

This application claims the benefit and priority to and is a U.S. National Phase of PCT International Application Number PCT/JP2005/018964, filed on Oct. 14, 2005, designating the United States of America, which claims priority under U.S.C. §119 to Japanese Application 2004-300122 filed on Oct. 14, 2004. The disclosures of the above-described applications are hereby incorporated by reference in their entirety.

TECHNICAL FIELD

The present invention relates to a physical vapor deposition system, more particularly relates to a physical vapor deposition system emitting microparticles generated from atoms evaporated from an evaporation source and riding on a supersonic jet and depositing these on a substrate for film formation.

BACKGROUND ART

In recent years, the importance of coating technology has been rapidly rising. Various coating methods have been developed.

However, no coating method able to form a high density coating film of a thickness of several tens to several hundreds of micrometers has been known.

The document (A. Yumoto, F. Hiroki, I. Shioda, N. Niwa, Surface and Coatings Technology, 169-170, 2003, 499-503) and the document (Atsushi Yumoto, Fujio Hiroki, Ichiro Shiota, Naotake Niwa: Formation of Ti and Al Films by Supersonic Free Jet PVD, Japan Metal Society Journal, Vol. 65, No. 7 (2001), pp. 635-643) disclose a supersonic free jet (SFJ)-physical vapor deposition (PVD) system.

This SFJ-PVD system is provided with an evaporation chamber and a film formation chamber.

The evaporation chamber is provided with an evaporation source material disposed on a water cooled hearth and an electrode made of a high melting point metal (specifically tungsten). The interior of the evaporation chamber is reduced once to a predetermined pressure, then the atmosphere changed to a predetermined gas, then the evaporation source is used as an anode an electrode made of a high conductivity metal located at a position a certain distance away from the anode is used as a cathode, and a negative voltage and a positive voltage are applied to them to induce an arc discharge between the two poles, that is, transfer type arc plasma is used, to heat and evaporate the evaporation source material. In the evaporation chamber rendered to the predetermined gas atmosphere, atoms evaporated due to the heating of the evaporation source agglomerate with each other whereby microparticles having diameters of the nanometer order (hereinafter referred to as "nano particles") are obtained.

The obtained nano particles ride the flow of gas induced by a pressure difference (vacuum degree difference) between the evaporation chamber and the film formation chamber pass through a transfer pipe and be transferred to the film formation chamber. In the film formation chamber, a substrate for film formation is disposed.

The flow of gas due to the pressure difference is accelerated to the supersonic speed of about Mach 3.6 by a specially designed supersonic nozzle (Laval nozzle) attached to a front end of the transfer pipe connecting the evaporation chamber to the film formation chamber. The nano particles ride on the stream of the supersonic free jet, are accelerated to a high speed, and are ejected into the film formation chamber and deposited on the substrate for film formation.

By using the above SFJ-PVD system, it becomes possible to form a high density coating film having a thickness of several tens to several hundreds of micrometers at a low temperature.

Plasma torches can be roughly classified into the transfer type and the non-transfer type.

FIG. 1A and FIG. 1B are schematic views of the configurations of plasma torches of the transfer type and the non-transfer type according to the prior art.

As shown in FIG. 1A, a transfer type plasma torch is comprised of a substantially cylindrical plasma tip 1 at the center of the inner side of which a rod shaped internal electrode 3 acting as the cathode is inserted. By applying a positive voltage to a heated object S and a negative voltage to the internal electrode 3, arc plasma is induced due to the discharge between the heated object S and the internal electrode 3 and thereby the heated object 3 is heated.

On the other hand, as shown in FIG. 1B, a non-transfer type plasma torch is comprised of a substantially cylindrical plasma tip 1 at the center inside which an internal electrode 3 is inserted. The plasma tip 1 is used as the anode and the internal electrode 3 is used as the cathode to induce an arc discharge between the poles. Plasma gas G is supplied between the poles. The heated object S is heated using the plasmatized gas as a medium.

A transfer type plasma torch has the advantage that the energy efficiency is high since current flows to the heated object to generate Joule's heat, but needs an electrode for generating the plasma and holding the plasma until the heated object melts and becomes conductive, so is not suitable for heating and melting an insulator. Further, to hold the arc voltage constant at the time of arc discharge, it is necessary to keep the distance between the two poles in constant. However, the anode side constituted by the heated object changes in its shape and volume successively due to melting and evaporation, therefore it is not easy to precisely control the amount of evaporation from the heated object.

On the other hand, a non-transfer type plasma torch has the advantages that it can generate plasma without being influenced by the material of the heated object since current does not flow to the heated object and that a starting property and stability of the plasma are high and controllability of the amount of heating is better in comparison with heating by a transfer type plasma torch.

Note that a non-transfer type plasma torch has two electrodes of the anode (plasma tip) and the cathode (internal electrode) in the torch. They must be insulated from each other. For this reason, in a conventional non-transfer type plasma torch, BAKELITE® phenol resin, or another polymer based insulating material is used in order to secure insulation between the two electrodes.

Because of the above polymer-based insulating material and other torch materials, when using the conventional non-transfer type plasma torch in an ultra-high vacuum environment, outgas ends up being generated.

For this reason, in a SFJ-PVD system, when using the plasma generated in a plasma torch to generate nano particles from an evaporation source, the obtained nano particles end up being polluted by the outgas.

Further, when there are a plurality of evaporation chambers, it is necessary to uniformly mix for example first microparticles and second microparticles. In this case, a first fluid including the first microparticles and a second fluid including the second microparticles are mixed.

For example, the Y-shaped fluid mixing device shown in FIG. 2 may be used to mix the above first and second fluids.

The Y-shaped fluid mixing device is comprised of a first inflow port 101 into which a first fluid 100 flows and a second inflow port 111 into which a second fluid 110 flows merging for mixture at a merging part 120, a mixture of the first fluid 100 and the second fluid 110 being taken out of a takeout port 130.

In the above Y-shaped mixing device, even when making the first fluid and the second fluid simultaneously flow in, due to the viscosities etc. of the fluids, sometimes they will not be mixed at the merging part, but will end up being discharged from the takeout port while substantially separated. Uniform mixture is sometimes difficult.

Here, for more uniform mixing of the first fluid and the second fluid, electrical energy from the outside is used to the mechanically control the inflows of the first fluid and the second fluid to the takeout port. More specifically, as shown in FIG. 2, the first fluid and the second fluid are controlled so as to alternately flow to the takeout port. By making the amounts of fluids alternately flowing in smaller, it becomes possible to more uniformly mix the first fluid and the second fluid.

Therefore, for mixing the first fluid and the second fluid as described above, a method of mixing fluids such as the conventional Y-shaped mixing device not requiring electricity or other energy from the outside and not providing mechanical moving parts is demanded.

DISCLOSURE OF THE INVENTION

Problem to be Solved by the Invention

The problem to be solved is that a non-transfer type plasma torch using BAKELITE® phenol resin, which has been used in conventional physical vapor deposition systems causes the problem of generation of outgas in an ultra-high vacuum environment.

Further, is problem is that when there are a plurality of evaporation chambers in a conventional physical vapor deposition system, for mixing two fluids, it is difficult to mix the two fluids without using electricity or other energy from the outside and without using any mechanical moving parts.

Means for Solving the Problem

The physical vapor deposition system of the present invention has an evaporation chamber provided inside it with an evaporation source and a plasma torch, using plasma generated by the plasma torch under a predetermined gas atmosphere or the ambient air atmosphere to heat and evaporate the evaporation source, and generating microparticles from the evaporated atoms and a film formation chamber provided inside it with a supersonic nozzle connected to a transfer pipe acting as a route for conveying a gas including the microparticles from the evaporation chamber and a substrate for film formation, making the microparticles transferred from the evaporation chamber ride on a supersonic gas flow created by the supersonic nozzle, and making the microparticles deposit on the substrate for film formation by physical vapor deposition, the plasma torch having a substantially cylindrical conductive anode, a polymer-based or non-polymer-based insulation pipe inserted inside the anode and generating less outgas than that by BAKELITE® phenol resin, and a rod shaped cathode inserted inside the insulation pipe so as not to contact the anode, a negative voltage being applied to the cathode and a positive voltage being applied to the anode and/or the evaporation source to thereby to form plasma.

The above physical vapor deposition system of the present invention has an evaporation chamber and a film formation chamber. The evaporation chamber is provided inside it with an evaporation source and a plasma torch, while the film formation chamber is provided inside with a supersonic nozzle and substrate for film formation.

Here, the plasma torch has a substantially cylindrical conductive anode, a polymer-based or non-polymer-based insulation pipe inserted inside the anode and generating less outgas than that by BAKELITE® phenol resin, and a rod shaped cathode inserted inside the insulation pipe so as not to contact the anode, applies negative voltage to the cathode and positive voltage to the anode and/or evaporation source to generate plasma which it uses to generate microparticles from the evaporation source, makes the obtained microparticles ride on a supersonic gas flow (stream of supersonic free jet) created by a supersonic nozzle, and deposits it on the substrate for film formation by physical vapor deposition.

Below, in the present specification, the "substantially cylindrical shape" includes a cylindrical shape and a substantially cylindrical shape.

In the physical vapor deposition system of the present invention described above, preferably the supersonic nozzle is a reducing-expanding pipe having a changing nozzle inside diameter and raises the gas flow induced due to the pressure difference between the evaporation chamber and the film formation chamber up to the supersonic speed.

More preferably, the supersonic nozzle creates a supersonic gas flow of Mach 1.2 or more.

In the physical vapor deposition system of the present invention described above, preferably the supersonic nozzle is designed in accordance with the type and composition of the gas and an exhaust capability of the film formation chamber based on one-dimensional or two-dimensional compressive fluid dynamics and is connected to the front end of the transfer pipe or is integrally formed with a front end portion of the transfer pipe.

More preferably, a heating means for heating the gas including the microparticles passing through the inside of the supersonic nozzle and/or the transfer pipe is provided at the supersonic nozzle and/or the transfer pipe per se or on an outer circumference of the supersonic nozzle and/or the transfer pipe.

More preferably, at least a portion of the supersonic nozzle and the transfer pipe is made of quartz, and an RF coil for changing the gas including the microparticles passing through the inside of the supersonic nozzle and/or the transfer pipe to plasma is provided on the outer circumference of the supersonic nozzle and/or the transfer pipe.

In the physical vapor deposition system of the present invention described above, preferably, in the plasma torch, a plasma gas distributor made of ceramic for positioning the relative positions of the anode and the cathode and ensuring that the plasma gas supplied to the cathode is equally distributed is provided in the vicinity of the front end of the cathode and between the anode and the cathode.

More preferably, the insulation pipe is made of quartz, machinable ceramic, boron nitride, alumina, or a fluororesin.

In the physical vapor deposition system of the present invention described above, preferably, in the plasma torch, the cathode has internal structure comprised of a three-layer structure of a first hollow portion arranged at the center, a second hollow portion arranged on the outer circumference of the first hollow portion, and a third hollow portion arranged on the outer circumference of the second hollow portion.

More preferably, in the plasma torch, the first hollow portion of the cathode is a plasma gas supply pipe.

More preferably, in the plasma torch, the second hollow portion of the cathode is an inlet pipe of a coolant, and the third hollow portion of the cathode is an outlet pipe of the coolant.

In the physical vapor deposition system of the present invention described above, preferably, in the plasma torch, the anode has a built-in cooling pipe.

In the physical vapor deposition system of the present invention described above, preferably, in the plasma torch, a VCR joint and/or ICF flange is used as a vacuum seal.

In the physical vapor deposition system of the present invention described above, preferably, in the plasma torch, a system applying a positive voltage and a negative voltage to the anode and the cathode respectively to form the plasma and a system applying a positive voltage and a negative voltage to the evaporation source to be heated and the cathode respectively to form the plasma may be switched between or used together.

Alternatively, the physical vapor deposition system of the present invention has an evaporation chamber provided inside it with an evaporation source and a plasma torch, using plasma generated by the plasma torch under a predetermined gas atmosphere or the ambient air atmosphere to heat and evaporate the evaporation source, and generating microparticles from the evaporated atoms and a film formation chamber provided inside it with a supersonic nozzle connected to a transfer pipe acting as a route for conveying a gas including the microparticles from the evaporation chamber and a substrate for film formation, making the microparticles transferred from the evaporation chamber ride on a supersonic gas flow created by the supersonic nozzle, and making the microparticles deposit on the substrate for film formation by physical vapor deposition, the plasma torch having a substantially cylindrical conductive anode, a polymer-based or non-polymer-based insulation pipe inserted inside the anode and generating less outgas than that by BAKELITE® phenol resin, a rod shaped cathode inserted inside the insulation pipe so as not to contact the anode, and a holding pipe arranged at an outer circumference of the anode, the holding pipe having a first holding member electrically connected to the cathode and mechanically holding the cathode, a second holding member electrically connected to the anode and mechanically holding the cathode, and a third holding member for mechanically holding the anode and the cathode via the first holding member and the second holding member, at least the first holding member and second holding member and the second holding member and third holding member being joined by welding to an insulation member of ceramic, the first holding member, the second holding member, and the third holding member being integrally formed while insulated from each other, a VCR joint and/or ICF flange being used as a vacuum seal of the anode, the cathode, and the holding pipe, and a negative voltage being applied to the cathode and a positive voltage being applied to the anode and/or the evaporation source to thereby to form plasma.

The physical vapor deposition system of the present invention described above has an evaporation chamber and a film formation chamber. The evaporation chamber is provided inside it with an evaporation source and a plasma torch, while the film formation chamber is provided inside it with a supersonic nozzle and a substrate for film formation.

Here, the plasma torch has a substantially cylindrical conductive anode, a polymer-based or non-polymer-based insulation pipe inserted inside the anode and generating less outgas than that by BAKELITE® phenol resin, a rod shaped cathode inserted inside the insulation pipe so as not to contact the anode, and a holding pipe arranged at the outer circumference of the anode.

The holding pipe has a first holding member electrically connected to the cathode and mechanically holding the cathode, a second holding member electrically connected to the anode and mechanically holding the cathode, and a third holding member mechanically holding the anode and the cathode via the first holding member and the second holding member. At least the first holding member and second holding member and the second holding member and third holding member are joined by welding to an insulation member of ceramic. The first holding member, the second holding member, and the third holding member are integrally formed while insulated from each other. Further, a VCR joint and/or ICF flange is used as a vacuum seal of the anode, cathode, and holding pipe.

Plasma generated by applying a negative voltage to the cathode and a positive voltage to the anode and/or evaporation source is used to generate microparticles from the evaporation source. The obtained microparticles are made to ride on the supersonic gas flow (stream of supersonic free jet) created by the supersonic nozzle and deposited on the substrate for film formation by physical vapor deposition.

Alternatively, the physical vapor deposition system of the present invention has a first evaporation chamber provided inside it with a first evaporation source and a first plasma torch, using plasma generated by the first plasma torch under a predetermined gas atmosphere or the ambient air atmosphere to heat and evaporate the first evaporation source, and generating first microparticles from the evaporated atoms, a second evaporation chamber provided inside it with a second evaporation source and a second plasma torch, using plasma generated by the second plasma torch under a predetermined gas atmosphere or the ambient air atmosphere to heat and evaporate the second evaporation source, and generating second microparticles from the evaporated atoms, and a film formation chamber provided inside it with a fluid mixing portion and supersonic nozzle connected to a transfer pipe acting as the route for conveying the gas including the microparticles from the evaporation chambers and a substrate for film formation, mixing the first microparticles transferred from the first-evaporation chamber and the second microparticles transferred from the second evaporation chamber by the fluid mixing portion, making the mixed first microparticles and second microparticles ride on the supersonic gas flow created by the supersonic nozzle, and depositing the mixed first microparticles and second microparticles onto the substrate for film formation by physical vapor deposition, each of the first plasma torch and second plasma torch having a substantially cylindrical conductive anode, a polymer-based or non-polymer-based insulation pipe inserted inside the anode and generating less outgas than that by BAKELITE® phenol resin, and a rod shaped cathode inserted inside the insulation pipe so as not to contact the anode, a negative voltage being applied to the cathode and a positive voltage being applied to the anode and/or the first or second evaporation source to form plasma, and the fluid mixing portion having a first mixing nozzle having a substantially rectangular shaped first ejecting port and a second mixing nozzle having a second ejecting port having the same shape as that of the first ejecting port and provided coaxially facing the first mixing nozzle, ejecting the first fluid including the first microparticles from the first ejecting port, ejecting the second fluid including the second microparticles from the second ejecting port, and mixing the first fluid and the second fluid in a space between the first ejecting port and the second ejecting port.

The physical vapor deposition system of the present invention described above has a first evaporation chamber, a second evaporation chamber, and a film formation chamber. The first evaporation chamber is provided inside it with a first evaporation source and a first plasma torch, the second evaporation chamber is provided inside it with a second evaporation source and a second plasma torch, and the film formation chamber is provided inside it with a fluid mixing portion, supersonic nozzle, and a substrate for film formation.

Each of the first and second plasma torches has a substantially cylindrical conductive anode, a polymer-based or non-polymer-based insulation pipe inserted inside the anode and generating less outgas than that by BAKELITE® phenol resin, and a rod shaped cathode inserted inside the insulation pipe so as not to contact the anode. A negative voltage is applied to the cathode and a positive voltage is applied to the anode and/or first or second evaporation source to form plasma. The obtained plasma is used to generate first and second microparticles from the first and second evaporation sources.

The fluid mixing portion mixes the first microparticles transferred from the first evaporation chamber and the second microparticles transferred from the second evaporation chanter.

The mixed first microparticles and second microparticles are made to ride on the supersonic gas flow (stream of supersonic free jet) created by the supersonic nozzle, and the mixed first microparticles and second microparticles are deposited onto the substrate for film formation by physical vapor deposition.

Further, the fluid mixing portion has a first mixing nozzle having a substantially rectangular shaped first ejecting port and a second mixing nozzle having a second ejecting port having the same shape as that of the first ejecting port and provided coaxially facing the first mixing nozzle. The first fluid including the first microparticles is ejected from the first ejecting port, the second fluid including the second microparticles is ejected from the second ejecting port, and the first fluid and the second fluid are mixed in the space between the first ejecting port and the second ejecting port.

Below, in the present description, the "substantially rectangular shape" includes a rectangular shape and a substantially rectangular shape.

In the physical vapor deposition system of the present invention described above, preferably, in the fluid mixing portion, an aspect ratio (b/a) of a length a of a short side of the substantially rectangular shape and a length $\underline{b}$ of a long side is 4 to 6.

In the physical vapor deposition system of the present invention described above, preferably in the fluid mixing portion, an inter-nozzle distance between the first mixing nozzle and the second mixing nozzle is a distance 4 to 35 times the length of the short side of the substantially rectangular shape.

In the physical vapor deposition system of the present invention described above, preferably, in the fluid mixing portion, the first mixing nozzle has a part forming a taper shape where a size of a space through which the first fluid flows toward the first ejecting port becomes larger the further to the upstream side far from the first ejecting port than the downstream side near the first ejecting port in the vicinity of the first ejecting port, and the second mixing nozzle has a part forming a taper shape where a size of a space through which the second fluid flows toward the second ejecting port becomes larger the further to the upstream side far from the second ejecting port than the downstream side near the second ejecting port in the vicinity of the second ejecting port.

In the physical vapor deposition system of the present invention described above, preferably, in the fluid mixing portion, provision is made of a pair of partition plates arranged in a long side direction of the substantially rectangular shape so as to face each other sandwiching between them the space between the first ejecting port and the second ejecting port and preventing the first fluid and the second fluid from dispersing in the long side direction of the substantially rectangular shape.

More preferably, in the fluid mixing portion, the distance between the pair of partition plates is substantially equal with the length of the long side of the substantially rectangular shape.

Alternatively, the physical vapor deposition system of the present invention has a first evaporation chamber provided inside it with a first evaporation source and a first plasma torch, using plasma generated by the first plasma torch under a predetermined gas atmosphere or the ambient air atmosphere to heat and evaporate the first evaporation source, and generating first microparticles from the evaporated atoms, a second evaporation chamber provided inside it with a second evaporation source and a second plasma torch, using plasma generated by the second plasma torch under a predetermined gas atmosphere or the ambient air atmosphere to heat and evaporate the second evaporation source, and generating second microparticles from the evaporated atoms, and a film formation chamber provided inside it with a fluid mixing portion and supersonic nozzle connected to a transfer pipe acting as the route for conveying the gas including the microparticles from the evaporation chambers and a substrate for film formation, mixing the first microparticles transferred from the first evaporation chamber and the second microparticles transferred from the second evaporation chamber by the fluid mixing portion, making the mixed first microparticles and second microparticles ride on the supersonic gas flow created by the supersonic nozzle, and depositing the mixed first microparticles and second microparticles onto the substrate for film formation by physical vapor deposition, each of the first plasma torch and second plasma torch having a substantially cylindrical conductive anode, a polymer-based or non-polymer-based insulation pipe inserted inside the anode and generating less outgas than that by BAKELITE® phenol resin, a rod shaped cathode inserted inside the insulation pipe so as not to contact the anode, and a holding pipe arranged at an outer circumference of the anode, the holding pipe having a first holding member electrically connected to the cathode and mechanically holding the cathode, a second holding member electrically connected to the anode and mechanically holding the cathode, and a third holding member for mechanically holding the anode and the cathode via the first holding member and the second holding member, at least the first holding member and second holding member and the second holding member and third holding member being joined by welding to an insulation member of ceramic, the first holding member, the second holding member, and the third holding member being integrally formed while insulated from each other, a VCR joint and/or ICF flange being used as a vacuum seal of the anode, the cathode, and the holding pipe, a negative voltage being applied to the cathode and a positive voltage being applied to the anode and/or the first or second evaporation source to thereby to form plasma, and the fluid mixing portion having a first mixing nozzle having a substantially rectangular shaped first ejecting port and a second mixing nozzle having a second ejecting port having the same shape as that of the first ejecting port and provided coaxially facing the first mixing nozzle, ejecting the first fluid including the first microparticles from the first ejecting port, ejecting the second fluid including the second microparticles from the second ejecting port, and mixing the first fluid and the second fluid in a space between the first ejecting port and the second ejecting port.

The physical vapor deposition system of the present invention described above has a first evaporation chamber; a second evaporation chamber, and a film formation chamber. The first evaporation chamber is provided inside it with a first evaporation source and a first plasma torch, the second evaporation chamber is provided inside it with a second evaporation source and a second plasma torch, and the film formation chamber is provided inside it with a fluid mixing portion, a supersonic nozzle, and a substrate for film formation.

Each of the first and second plasma torches has a substantially cylindrical conductive anode, a polymer-based or non-polymer-based insulation pipe inserted inside the anode and generating less outgas than that by BAKELITE® phenol resin, a rod shaped cathode inserted inside the insulation pipe so as not to contact the anode, and a holding pipe arranged at the outer circumference of the anode.

The holding pipe has a first holding member electrically connected to the cathode and mechanically holding the cathode, a second holding member electrically connected to the anode and mechanically holding the cathode, and a third holding member mechanically holding the anode and the cathode via the first holding member and the second holding member, at least the first holding member and second holding member and the second holding member and third holding member are joined by welding to the insulation member of ceramic, and the first holding member, the second holding member, and the third holding member are integrally formed while insulated from each other. Further, a VCR joint and/or ICF flange is used as vacuum seal of the anode, cathode, and holding pipe.

A negative voltage is applied to the cathode and a positive voltage is applied to the anode and/or first or second evaporation source to form plasma. The obtained plasma is used to generate first microparticles and second microparticles from the first and second evaporation sources.

The fluid mixing portion mixes the first microparticles transferred from the first evaporation chamber and the second microparticles transferred from the second evaporation chamber.

The mixed first microparticles and second microparticles are made to ride on the supersonic gas flow (stream of supersonic free jet) created by the supersonic nozzle, and the mixed first microparticles and second microparticles are deposited onto the substrate for film formation by physical vapor deposition.

Further, the fluid mixing portion has a first mixing nozzle having a substantially rectangular shaped first ejecting port and a second mixing nozzle having a second ejecting port having the same shape as that of the first ejecting port and provided coaxially facing the first mixing nozzle. The first fluid including the first microparticles is ejected from the first ejecting port, the second fluid including the second microparticles is ejected from the second ejecting port, and the first fluid and the second fluid are mixed in the space between the first ejecting port and the second ejecting port.

Effect of the Invention

The physical vapor deposition system of the present invention uses, as the plasma torch, a polymer-based or non-polymer-based insulation pipe generating less outgas than that by BAKELITE® phenol resin Bakelite in order to insulate the plasma tip and the electrode. Since it does not use BAKELITE® phenol resin, it can be used while generating less outgas even in an ultra-high vacuum environment and can deposit microparticles having less contaminated active surfaces so as to form a dense film.

Further, as the fluid mixing portion for mixing the first microparticles and second microparticles, it is possible to utilize the oscillation phenomenon of coaxially facing colliding jet flows to uniformly mix the particles without using electricity or other energy from the outside and without using any mechanical moving parts.

BRIEF DESCRIPTION OF THE DRAWINGS

FIG. 7A is a schematic view of the configuration of a concrete example of a fluid mixing portion of the physical vapor deposition system according to the first embodiment, and FIG. 7B is a schematic view showing the parts disassembled for showing the structure of the fluid mixing portion shown in FIG. 7A.

DESCRIPTION OF NOTATIONS

1 . . . plasma tip, 3 . . . internal electrode, 10 . . . (first) evaporation chamber, 11, 21 . . . exhaust pipes, 12 . . . mass flow control, 13 . . . gas supply source, 14, 24 . . . crucibles, 15 . . . (first) evaporation source material, 16 . . . (first) plasma torch, 17, 27 . . . transfer pipes, 20 . . . second evaporation chamber, 25 . . . second evaporation source material, 26 . . . second plasma torch, 30 . . . film formation chamber, 31 . . . exhaust pipe, 32 . . . stage, 33 . . . substrate for film formation, 34 . . . fluid mixing portion, 35 . . . supersonic nozzle, 40 . . . anode, 40a . . . anode first member, 40b . . . anode second member, 40c . . . seal agent, 40h . . . opening, 41 . . .

cooling system, 41a ... cooling water inlet port, 41b ... cooling water outlet port, 41f ... cooling water, 50 ... insulation pipe, 51 ... gas distributor, 60 ... cathode, 61 ... first hollow portion, 61f ... plasma gas, 62 ... cooling system, 62a ... second hollow portion, 62b ... third hollow portion, 62f ... cooling water, 65 ... holding pipe, 66 ... first holding member, 67 ... second holding member, 68 ... third holding member, 69a, 69b ... insulation members, 70 ... first mixing nozzle, 71 ... first ejecting port, 72 ... first jet flow, 80 ... second mixing nozzle, 81 ... second ejecting port, 82 ... second jet flow, 90, 91 ... partition plates, 92, 93 ... openings, T1 ... first fluid supply pipe, T2 ... second fluid supply pipe, 94, 95 ... mixed fluids, 96 ... combined fluid, 100 ... first fluid, 101 ... first inflow port, 110 ... second fluid, 111 ... second inflow port, 120 ... merging part, 130 ... takeout port, S ... heated object, G ... plasma gas, VP1, VP2, VP3 ... vacuum pumps, and MR ... mixing region.

BEST MODE FOR CARRYING OUT THE INVENTION

Below, embodiments of the physical vapor deposition system according to the present invention will be explained with reference to the drawings.

First Embodiment

Figure 1A:
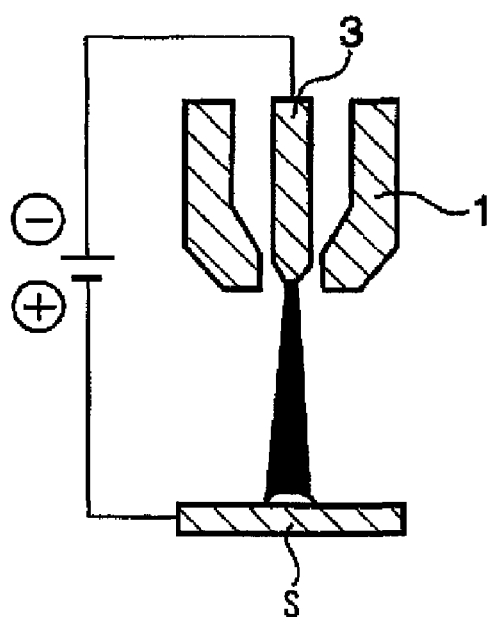
FIG. 1A and FIG. 1B are schematic views of the configuration of transfer type and non-transfer type plasma torches according to the prior art.
Figure 1B:
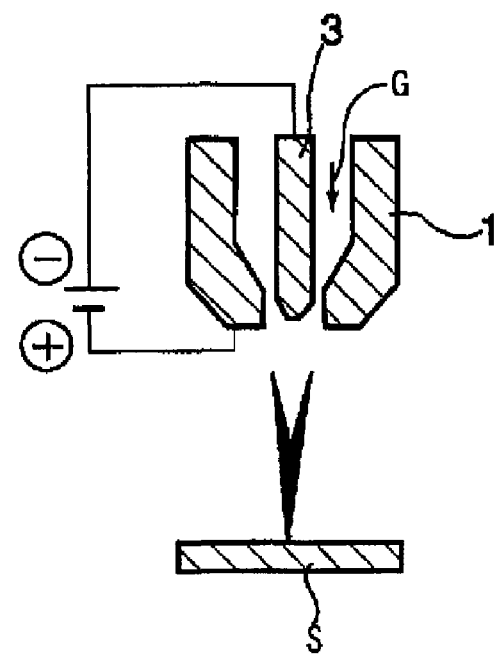
Figure 2:
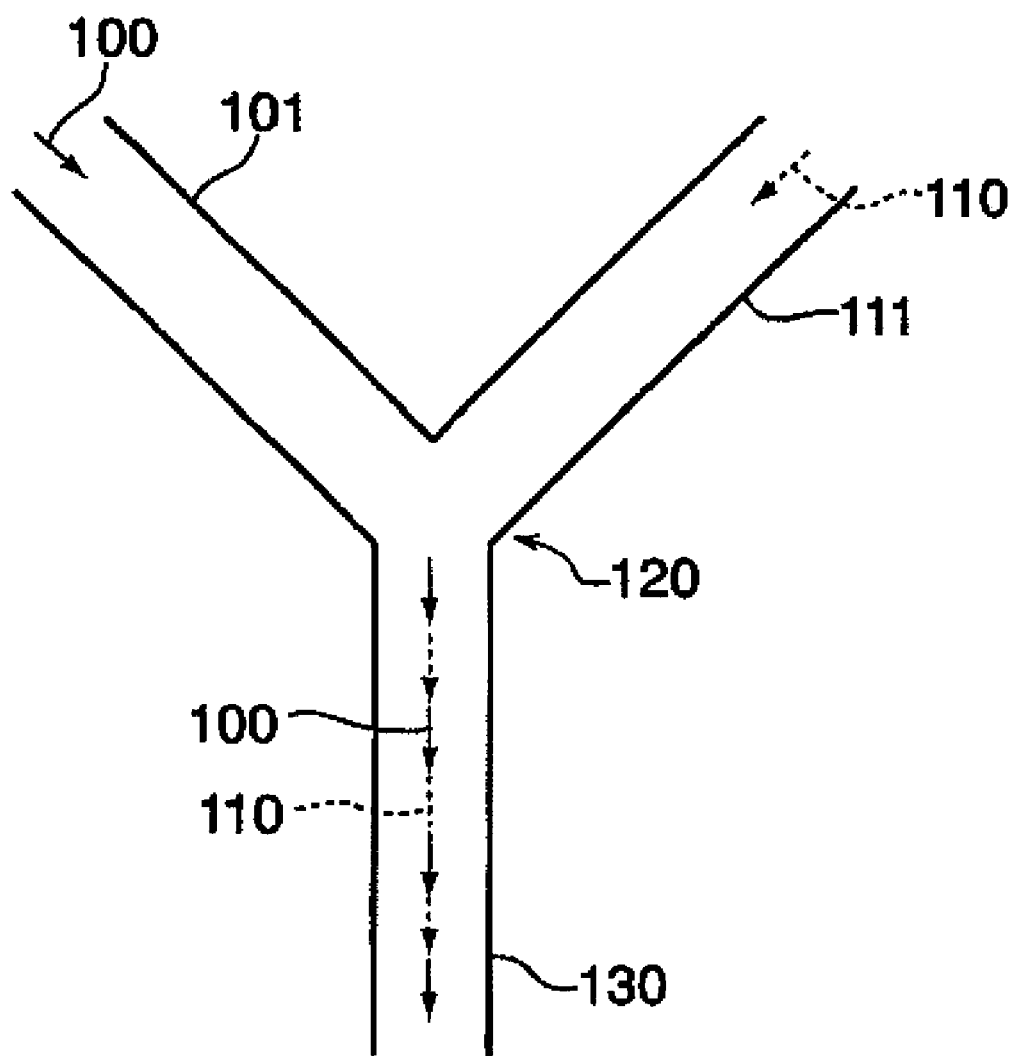
FIG. 2 is a schematic view of a Y-shaped fluid mixing device according to the prior art.
Figure 3:
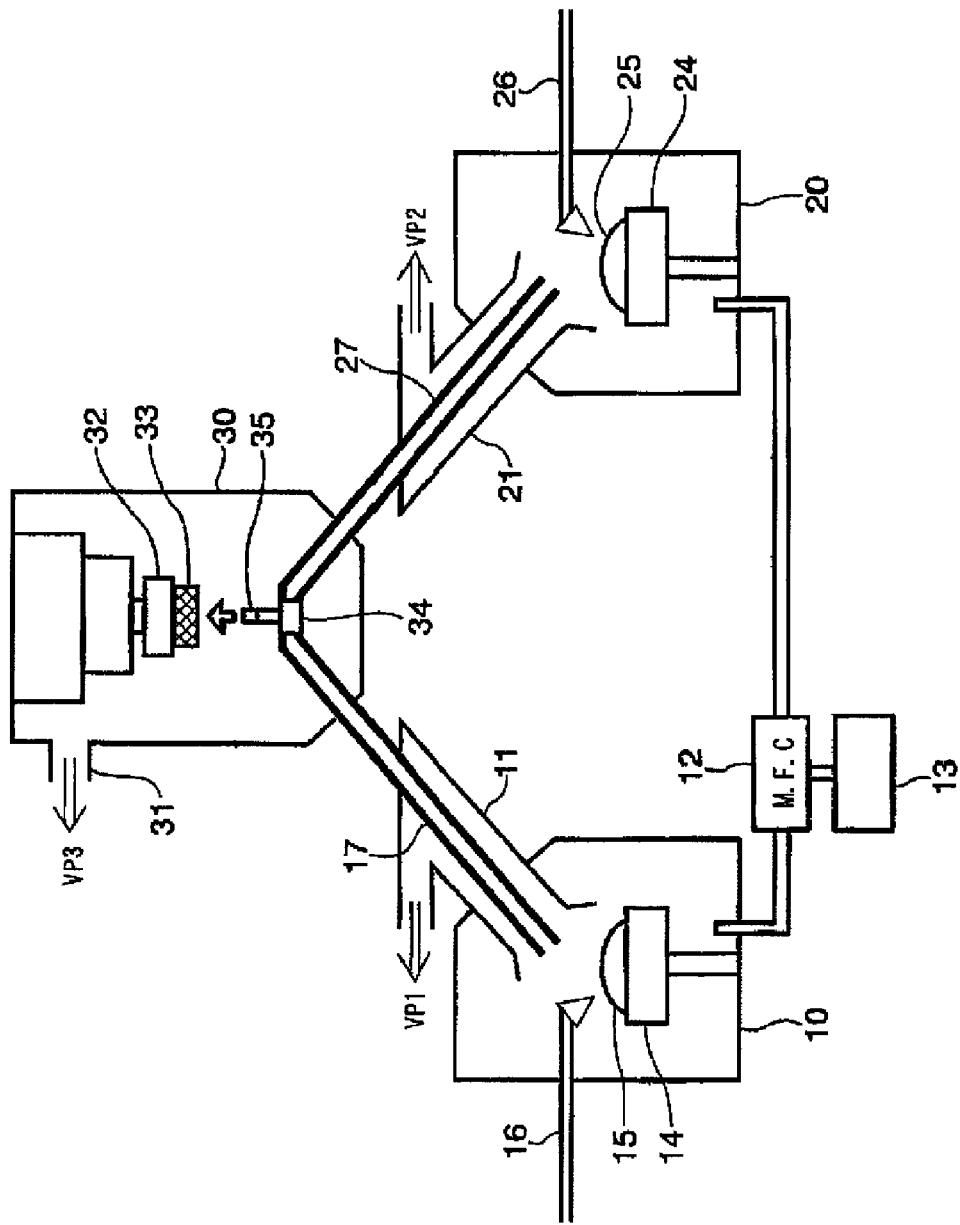
FIG. 3 is a schematic view of the configuration of a physical vapor deposition system according to a first embodiment of the present invention.

FIG. 3 is a schematic view of the configuration of a supersonic free jet (SFJ)-physical vapor deposition (PVD) system according to the present embodiment.

The SFJ-PVD system of the present embodiment is provided with a first evaporation chamber 10, a second evaporation chamber 20, and a vacuum chamber for the film formation constituted by a film formation chamber 30.

The first evaporation chamber 10 is provided with an exhaust pipe 11 connected to a vacuum pump VP1. The interior of the first evaporation chamber 10 is evacuated by operation of the vacuum pump VP1 and rendered an ultra-high vacuum atmosphere of for example about $10^{-10}$ Torr. Further, a gas supply source 13 provided in the first evaporation chamber 10 via a mass flow controller 12, according to a need, supplies an atmospheric gas such as He or $N_2$ into the first evaporation chamber 10 by a predetermined flow rate. Alternatively, the chamber may be rendered an ambient air atmosphere.

The first evaporation chamber 10 is provided with a water cooled copper crucible 14 in which a first evaporation source material 15 is placed. A first plasma torch 16 is provided in the vicinity of the first evaporation source material 15. Using the plasma gas generated by the discharge between the plasma tip constituting the first plasma torch 16 and the internal electrode as a medium, the first evaporation source material 15 is heated and evaporated by the non-transfer method, whereby first microparticles having sizes of the nanometer order (hereinafter also referred to as "first nano particles") are obtained from atoms evaporated from the first evaporation source material 15.

The obtained first nano particles are transferred to the film formation chamber 30 through a transfer pipe 17 together with the atmospheric gas in the first evaporation chamber 10.

The second evaporation chamber 20 has the same configuration as that of the first evaporation chamber 10.

Namely, the interior of the second evaporation chamber 20 is evacuated by the operation of a vacuum pump VP2 from an exhaust pipe 21 connected to the second evaporation chamber 20 to be made for example an ultra-high vacuum atmosphere of about $10^{-10}$ Torr. Further, a gas supply source 13 provided in the second evaporation chamber 20 via the mass flow controller 12, according to a need, supplies the atmospheric gas such as He or $N_2$ into the second evaporation chamber 20 by a predetermined flow rate. Alternatively, the chamber may be rendered an ambient air atmosphere.

Further, a second evaporation source material 25 is placed in a crucible 24 provided in the second evaporation chamber 20. Using the plasma gas generated by a second plasma torch 26 provided in the vicinity of this as a medium, the second evaporation source material 25 is heated and evaporated by the non-transfer method, whereby second microparticles having sizes of the nanometer order (hereinafter, also referred to as "second nano particles") are obtained from atoms evaporated from the second evaporation source material 25.

The obtained second nano particles are transferred to the film formation chamber 30 through a transfer pipe 27 together with the atmospheric gas in the second evaporation chamber 20.

The film formation chamber 30 is provided with an exhaust pipe 31 connected to a vacuum pump VP3. The interior of the film formation chamber 30 is evacuated by the operation of the vacuum pump VP3 to be made an ultra-high vacuum atmosphere of for example about $10^{-10}$ Torr.

The film formation chamber 30 is provided with a stage 32 driven in an X-Y direction. This stage 32 has a substrate for film formation 33 fixed to it.

The substrate for film formation is not particularly limited, but use can be made of for example pure titanium sheet (JIS grade 1), A1050 aluminum alloy sheet, and SUS304 stainless steel sheet. The substrate for film formation is preferably used after supersonic cleaning in acetone before being set in the film formation chamber.

A fluid mixing portion 34 is provided at a merging part of the front end of the transfer pipe 17 from the first evaporation chamber 10 and the front end of the transfer pipe 27 from the second evaporation chamber 20. A supersonic nozzle (Laval nozzle) 35 is provided so as to extend from the center of the fluid mixing portion 34. At the outer circumference on the fluid mixing portion 34 side of each transfer pipe (17, 27), a not shown coil heater may be provided to enable heating.

When the first nano particles are generated in the above first evaporation chamber 10 and the second nano particles are generated in the second evaporation chamber 20, a flow of gas occurs due to the pressure difference between the first and second evaporation chambers (10, 20) and the film formation chamber 30, and the first nano particles and second nano particles are transferred to the film formation chamber 30 through the transfer pipes together with the atmospheric gas.

The first fluid including the first nano particles and the second fluid including the second nano particles are mixed at the fluid mixing portion 34 and ejected from the supersonic nozzle (Laval nozzle) 35 attached to the center of the fluid mixing portion 34 as a supersonic gas flow (stream of supersonic free jet) into the film formation chamber 30 toward the substrate for film formation 33. Namely, the first nano particles and the second nano particles are mixed at the fluid mixing portion 34.

The supersonic nozzle 35 is designed in accordance with the type and composition of the gas and the exhaust capability of the film formation chamber based on one-dimensional or two-dimensional compressive fluid dynamics and is connected to the front end of the transfer pipe or is integrally formed with the front end portion of the transfer pipe. Specifically, this is a reducing-expanding pipe having a changing nozzle inside diameter and can raise the gas flow induced due to the pressure difference between the evaporation chamber and the film formation chamber up to the supersonic speed of for example Mach 1.2 or more.

The first nano particles and second nano particles are for example accelerated up to the supersonic speed of about Mach 3.6 by the supersonic nozzle 35, ejected into the film formation chamber 30 while riding on the supersonic gas flow, and deposited (by physical vapor deposition) on the substrate for film formation 33.

Next, the plasma torches used as the first plasma torch 16 and second plasma torch 26 described above will be explained.

Figure 4:
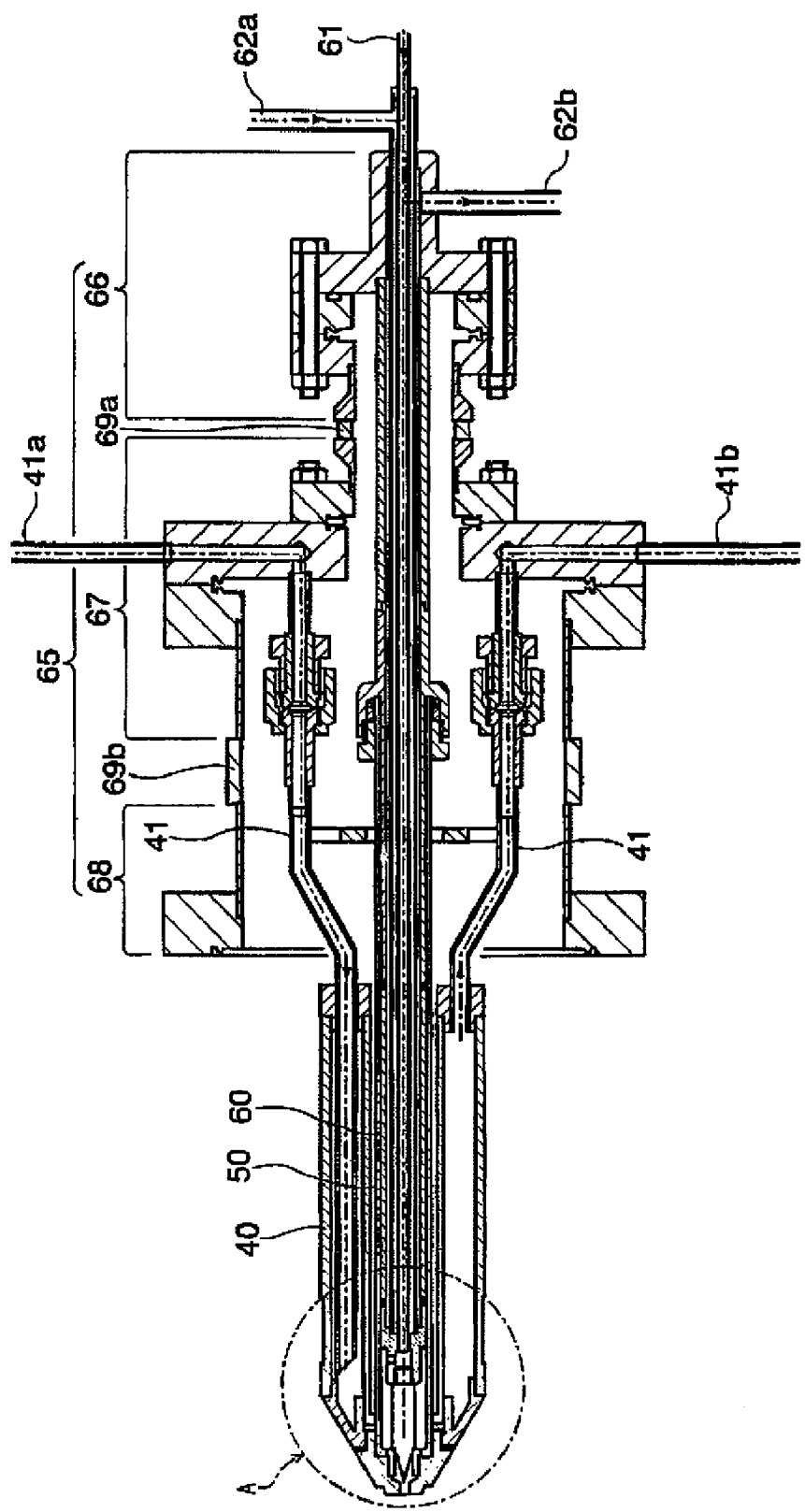
FIG. 4 is a schematic view of the configuration showing a partial sectional structure of a plasma torch forming part of the physical vapor deposition system according to the first embodiment of the present invention.
Figure 5:
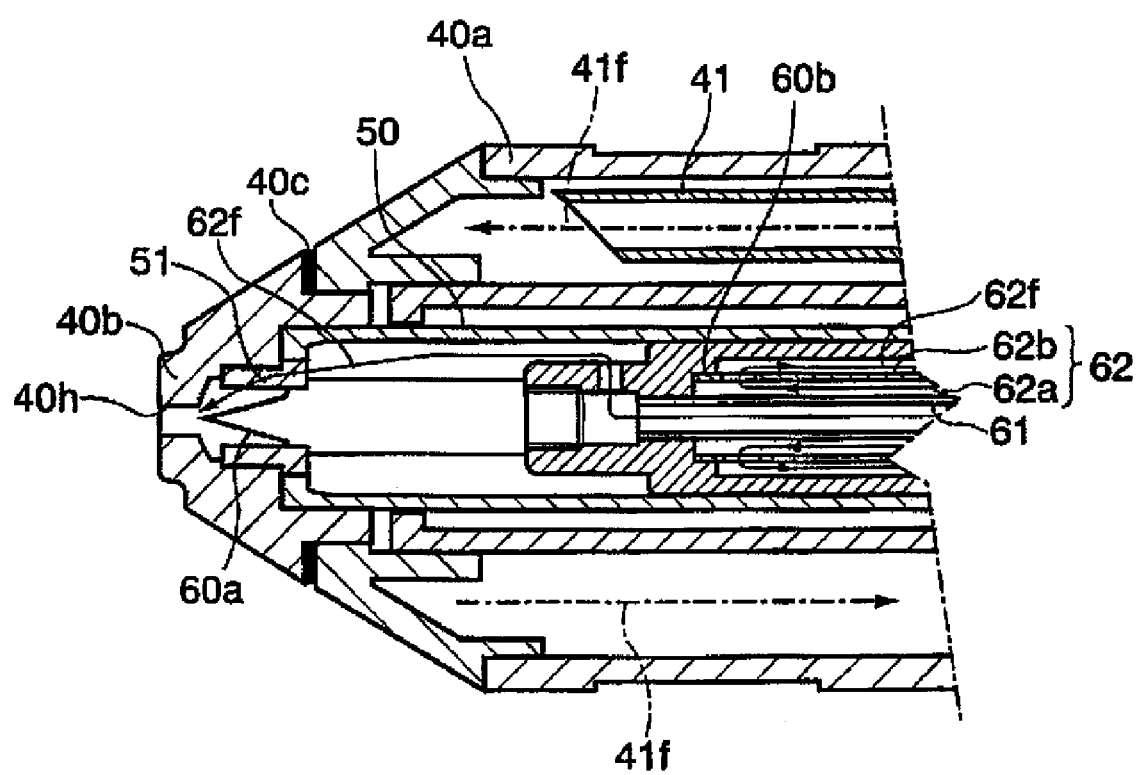
FIG. 5 is an enlarged view of an A portion in FIG. 4.

FIG. 4 is a schematic view of the configuration showing the partial sectional structure of a plasma torch forming part of the physical vapor deposition system according to the present embodiment. Further, FIG. 5 is an enlarged diagram of the A portion in FIG. 4.

The plasma torch according to the present embodiment has a substantially cylindrical conductive anode 40, a polymer-based or non-polymer-based insulation pipe 50 generating less outgas than that by BAKELITE® phenol resin and inserted inside the anode, and a rod shaped cathode 60 inserted inside the insulation pipe 50 so as not to contact the anode 40.

The anode 40 is assembled from an anode first member 40a having a substantially cylindrical shape and an anode second member 40b provided on the front end of the anode first member 40a connected via a copper seal agent 40c. The anode first member 40a and anode second member 40b are for example comprised of stainless steel, coppers tungsten, or another metal material.

The anode first member 40a has a thick substantially cylindrical shape and has a partially hollow structure. It has a water cooling system 41 connected to a cooling water inlet port 41a and a cooling water outlet port 41b buried inside it and is cooled by cooling water 41f.

Due to the cooling system 41, the anode 40 which ends up being heated by the generation of plasma can be efficiently cooled.

The anode second member 40b is provided so as to cover one end portion of the substantially cylindrical shape anode first member 40a and has an opening 40h at its center. An inside diameter of the anode second member 40b is for example gradually narrowed in several steps from the inside diameter of the anode first member 40a, while the outside diameter of the anode second member 40b is smoothly narrowed toward the front end from the outside diameter of the anode first member 40a resulting in a taper shape.

In this way, in the vicinity of the front end of the cathode 60, the diameter of the anode 40 is narrowed.

The insulation pipe 50 is made of a polymer-based or non-polymer-based material generating less outgas than that by BAKELITE® phenol resin. For example, it is made of quartz, a machinable ceramic, boron nitride (BN), alumina, or a fluorine-based resin. For example, quartz and machinable ceramics are materials which substantially do not generate outgas and can be relatively cheaply prepared for forming a tubular shape for use in the present embodiment. In particular, quartz pipes having various sizes are commercially available, so an insulation pipe having a desired size can be easily prepared.

The above machinable ceramics are ceramics which can be easily machined. They may be roughly classified into ones containing lamellar structures such as mica inside them and ones containing a large number of minute cracks in structure. As the former, there are for example $KMg_3AlSi_3O_{10}F_2$ fluorine phlogopite and other mica crystallized glass, while as the latter, there are aluminum titanate etc.

The insulation pipe 50 is made an outside diameter conforming with the inside diameter of the anode 40 comprised of the anode first member 40a and anode second member 40b etc. and is inserted at the inside of the anode 40 so as to pass through the anode first member 40a and be stopped by the stepwise structure inside the anode second member 40b.

The cathode 60 is assembled from a cathode first member 60a provided at the front end portion and a cathode second member 60b supporting the cathode first member 60a connected together. The cathode first member 60a and cathode second member 60b are made from for example stainless steel, copper, tungsten, or another metal material.

The cathode first member 60a is supported at its base by the cathode second member 60b and held so that the vicinity of the front end is engaged with a gas distributor 51. The gas distributor 51 is provided fit with the front end of an insulation pipe 50 so as to be stopped by the stepwise structure inside the anode second member 40b.

The gas distributor 51 described above is made of for example a ceramic or other non-polymer-based insulating material. It is comprised of a material that substantially does not generate outgas even under an ultra-high vacuum environment. It is provided in the vicinity of the front end of the cathode between the anode and the cathode so as to position the relative positions of the anode and the cathode so that the anode and the cathode do not contact each other and thereby prevent short-circuiting of the two. Further, the gas distributor 51 is provided with a fine opening and can ensure that the plasma gas supplied with respect to the cathode is evenly distributed.

The cathode second member 60b has as the internal structure a three-layer structure of a first hollow portion 61 arranged at the center, a second hollow portion 62a arranged on the outer circumference of the first hollow portion, and a third hollow portion 62b arranged at the outer circumference of the second hollow portion 62a.

Here, the first hollow portion 61 in the cathode second member 60b is the plasma gas supply pipe. From here, plasma gas 61f can be supplied to the front end portions of the anode 40 and the cathode 60 via the above gas distributor 51.

Further, the second hollow portion 62a in the cathode second member 60b is the inlet pipe of a coolant constituted by cooling water 62f, and the third hollow portion 62b is the outlet pipe of the cooling water.

By having the cooling system 62 constituted by the second hollow portion 62a and the third hollow portion 62b, that is, a cooling system separated from the cooling system 41 of the anode 40, the cathode 60 inserted into the insulation pipe 50 having not high heat conductivity can be efficiently cooled.

Further, in the plasma torch of the present embodiment, a holding pipe 65 is arranged at the outer circumference of the anode 40.

The holding pipe 65 has a first holding member 66 electrically connected to the cathode 60 and mechanically holding the cathode, a second holding member 67 electrically connected to the anode 40 and mechanically holding the cathode, and a third holding member 68 mechanically holding the anode 40 and the cathode 60 via the first holding member 66 and the second holding member 67. At least the first holding member 66 and second holding member 67 and the second holding member 67 and third holding member 68 are joined by welding to insulation members (69a, 69b) of ceramic. The first holding member 66, second holding member 67, and third holding member 68 are integrally formed while insulated from each other.

As described above, in the plasma torch according to the present embodiment, the anode and the cathode are made of stainless steel or another metal material and are insulated by the insulation pipe in structure.

Further, in the plasma torch according to the present embodiment, as a vacuum seal, use is made of a VCR joint and/or ICF flange.

At the front end portions of the anode 40 and the cathode 60, the inner wall of the anode second member 40b and the front end of the cathode first member 60a are separated by a predetermined distance. By supplying the plasma gas 61f to this region and further applying a positive voltage and negative voltage to the anode and the cathode, plasma is generated by the discharge between the anode and the cathode. Namely, a so-called non-transfer plasma torch is formed.

The obtained plasma can be supplied from the opening 40h on the front end of the anode to the outside of the plasma torch.

As described above, the plasma torch of the SFJ-PVD system of the present embodiment uses a polymer-based or non-polymer-based insulation pipe generating less outgas than that by BAKELITE® phenol resin in order to insulate the plasma tip and the electrode. Since it does not use Bakelite, it can be used while generating less outgas even under an ultra-high vacuum environment.

Further, by providing the holding pipe for holding the entire plasma torch at the outer circumference of the anode and applying predetermined potentials to the anode and the cathode, an ultra-high vacuum environment can be handled without generating outgas.

Accordingly, in the SFJ-PVD system according to the present embodiment, when using the plasma generated by the plasma torch to generate nano particles from the evaporation source, using the above plasma torch enables generation of nano particles without contamination by outgas. By using the plasma torch in the present embodiment under an ultra-high vacuum environment or under a gas substituted atmosphere in this way, the entry of impurities into the heated object can be prevented and microparticles having less contaminated active surfaces can be deposited and thereby a dense film can be formed.

Further, the SFJ-PVD system according to the present embodiment can be used in a broad range of atmospheric pressures from an ultra-high vacuum environment of about $10^{-10}$ Torr to atmospheric pressure.

The SFJ-PVD system according to the present embodiment can be operated by switching between for example a non-transfer type operation of applying a positive voltage and negative voltage to the anode and the cathode respectively to form the plasma and a transfer type operation of applying a positive voltage and negative voltage to the heated first or second evaporation source and the cathode respectively to form the plasma or by using the two types of operation together.

By switching these or using them together, the advantage of the transfer type of the high energy efficiency and the advantages of the non-transfer type of use irrespective of the material of the non-heated object, the high starting property and stability of the plasma, and the good controllability can be enjoyed and therefore the heated target can be heated more efficiently. In both of the transfer type and the non-transfer type, substantially no outgas is generated by use under an ultra-high vacuum environment.

Next, the above fluid mixing portion 34 will be explained.

Figure 6A:
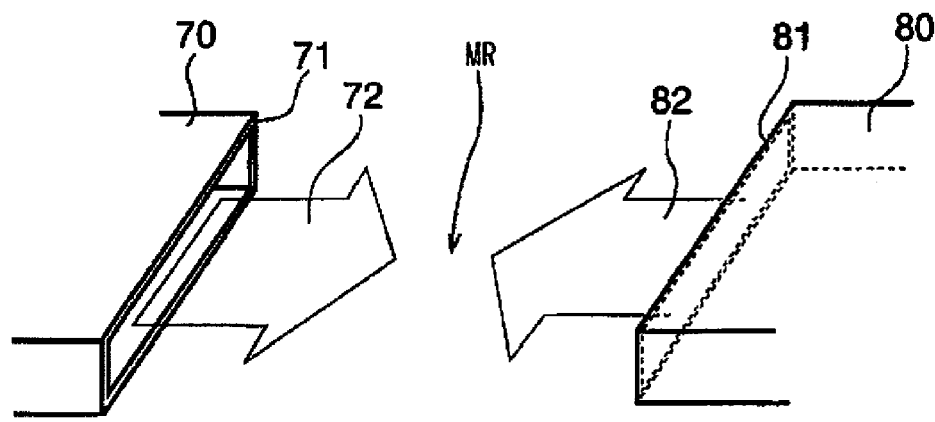
FIG. 6A is a schematic view of the configuration of a fluid mixing portion of the physical vapor deposition system according to the first embodiment.

FIG. 6A is a schematic view of the configuration of a fluid mixing portion of the physical vapor deposition system according to the present embodiment.

A first ejecting port 71 of a first mixing nozzle 70 and a second ejecting port 81 of a second mixing nozzle 80 are arranged coaxially facing each other.

The first ejecting port 71 and the second ejecting port 81 have the same substantially rectangular shape. The first fluid including first microparticles is ejected from the first ejecting port 71 as a first jet flow 71, and the second fluid including second microparticles is ejected from the second ejecting port 81 as a second jet flow 82. The first fluid and second fluid are mixed in a space between the first ejecting port 71 and the second ejecting port 81 (mixing region MR).

The above fluid mixing portion has mixing nozzles formed with rectangular ejecting ports for introducing two fluids. Channels of the first fluid and second fluid to be mixed are connected to the mixing nozzles. Fluids ejected from facing ejecting ports of the mixing nozzles collide with each other as jet flows.

Figure 6B:
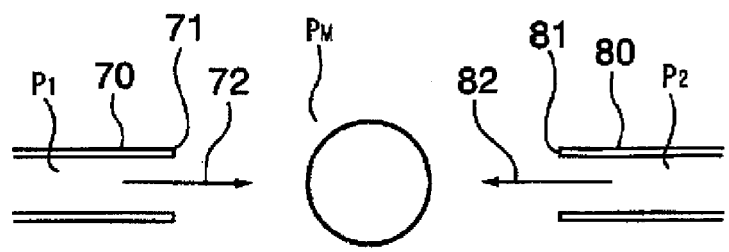
FIG. 6B to FIG. 6D are schematic views for explaining a mechanism of the mixing of a first fluid and a second fluid.
Figure 6C:
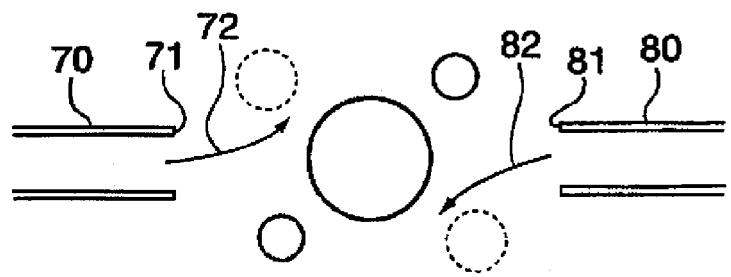
Figure 6D:
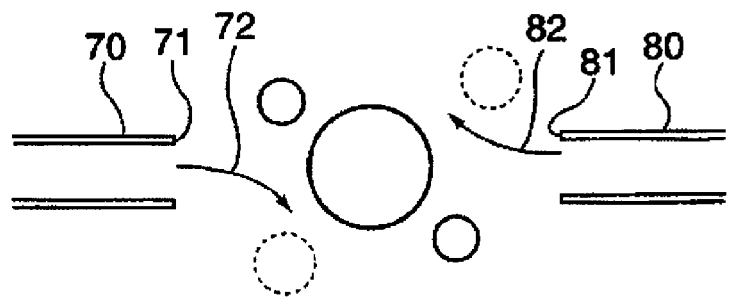

FIG. 6B to FIG. 6D are schematic views for explaining a mechanism of the mixing of the first fluid and second fluid. This mechanism utilizes the oscillation phenomenon of the coaxially facing colliding jet flows disclosed in Keijiro Yamamoto, Akira Nomoto, Tadao Kawashima, Noriaki Nakatsuchi: Oscillation Phenomenon of Coaxially Facing Colliding Jet Flows, Oil Pressure and Air Pressure (1975) pp. 68-77.

In these drawings, regions having relatively high pressures are surrounded by solid lines, and regions having relatively low pressures are surrounded by broken lines.

As shown in FIG. 6B, the first jet flow 72 of the first fluid is ejected from the first ejecting port 71 of the first mixing nozzle 70 with a pressure $P_1$, while the second jet flow 82 of the second fluid is ejected from the second ejecting port 81 of the second mixing nozzle 80 with a pressure $P_2$.

At this time, in the space between the first ejecting port 71 and the second ejecting port 81, the first jet flow 72 and the second jet flow 82 collide as jet flows.

By the collision of these first jet flow 72 and second jet flow 82, a region having a high pressure PM is created in the center of the space between the first ejecting port 71 and the second ejecting port 81. As a result, the flows of the first jet flow 72 and the second jet flow 82 become unstable.

The first jet flow 72 and the second jet flow 82 which become unstable in flow as described above are deflected in the reverse directions to each other by some sort of outer disturbance as shown in FIG. 6C. The deflected sides of the first jet flow 72 and the second jet flow 82 become low pressure due to swirling, while conversely the non-deflected sides becomes high pressure due to interference of jet flows. Further, the colliding surfaces are high in pressure, so the deflection of the first jet flow 72 and the second jet flow 82 increases more.

When the deflections of the first jet flow 72 and the second jet flow 82 become larger, the two jet flows pass each other. These passing surfaces become low in pressure due to the swirling of the two jet flows.

The above pressure drop reverses the pressure distribution in the direction vertical to the nozzle axes of the ejecting ports (71, 81) of the nozzles and pulls in the first jet flow 72 and the second jet flow 82 again to form the collision state. Since the pressure distribution is reversed in the direction vertical to the nozzle axes of the ejecting ports (71, 81) of the nozzles, the deflections of the first jet flow 72 and the second jet flow 82 also reverse resulting in the state as shown in FIG. 6D.

A process of reversal of the pressure distribution and the deflection of jet flows in the direction vertical to the nozzle axes of the ejecting ports (71, 81) of the nozzles is repeated, whereby oscillation of the coaxially facing colliding jet flows occurs. By sustaining this oscillation, the first jet flow 72 and the second jet flow 82 can be mixed.

The shapes, inter-nozzle distance, Strouhal Numbers, etc. of the first mixing nozzle 70 and the second mixing nozzle 80 suitable for mixing of the first jet flow 72 and the second jet flow 82 are determined according to the types and Reynolds numbers of the fluids. To mix the gas phase first fluid including the first nano particles and the gas phase second fluid including the second nano particles as in the present embodiment, the first ejecting port 71 of the first mixing nozzle 70 and the second ejecting port 81 of the second mixing nozzle 80 preferably have an aspect ratio (b/a) of a length a of the short side of the substantially rectangular shape and a length b of the long side of 4 to 6.

Further, the inter-nozzle distance of the first mixing nozzle and the second mixing nozzle is preferably a distance 4 to 35 times the length of the short side of the substantially rectangular shape.

Further, preferably provision is made of a pair of partition plates (90, 91) arranged in the long side direction of the substantially rectangular shape so that they face each other while sandwiching between them the space between the first ejecting port 71 and the second ejecting port 81 and preventing dispersion of the first fluid and second fluid in the long side direction of the substantially rectangular shape.

By providing the above partition plates, the collided jet flows easily oscillate and can be mixed more uniformly.

Furthermore, the distance between the pair of partition plates (90, 91) is more preferably substantially equal to the length of the long side of the substantially rectangular shape. Due to this, the dispersion of the first jet flow 72 of the first fluid and the second jet flow 82 of the second fluid in the long side direction of the substantially rectangular shape of the ejecting ports is prevented, and the effect facilitating the oscillation can be raised.

According to the fluid mixing portion forming part of the SFJ-PVD system according to the present embodiment described above, it is possible to utilize the oscillation phenomenon of the coaxially facing colliding jet flows to mix solid-gas two-phase gas flows of jet flows of gas carrying nano particles and possible to precisely mix different types of powder materials in two jet flows without using electricity or other energy from the outside and without using any mechanical moving parts. In the SFJ-PVD system, by mixing the different types of nano particles obtained from the evaporation sources and depositing them onto the target substrate, different types of materials can be uniformly deposited by physical vapor deposition.

Further, the above fluid mixing portion does not need any mechanical moving parts, therefore there are few restrictions on processing and/or dimensions and a compact shape can be achieved, so installation in a narrow space is also possible.

FIG. 7A is a schematic view of the configuration of a concrete example of the fluid mixing portion of the physical vapor deposition system according to the first embodiment, and FIG. 7B is a schematic view showing the parts disassembled for showing the structure of the fluid mixing portion shown in FIG. 7A.

Figure 8A:
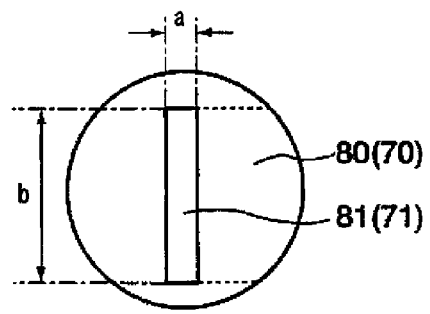
FIG. 8A is a side view of the fluid mixing portion of FIG. 7A from an A direction.
Figure 8B:
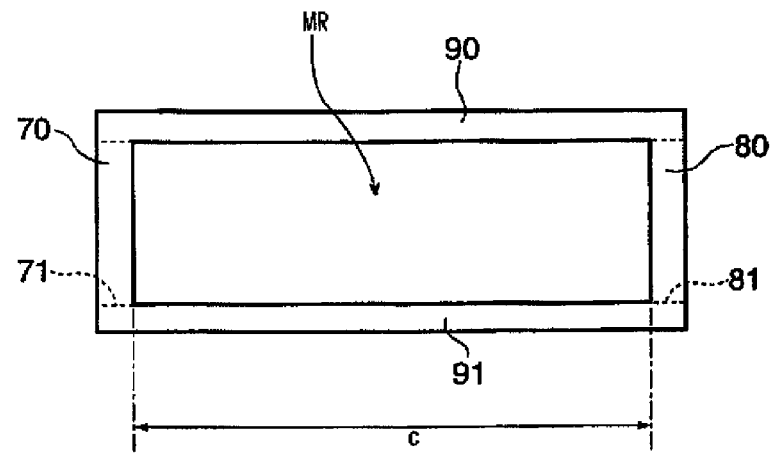
FIG. 8B is a front view from a B direction.

Further, FIG. 5A is a side view from an A direction of the fluid mixing portion of FIG. 7A, and FIG. 8B is a front view from a B direction.

Figure 9A:
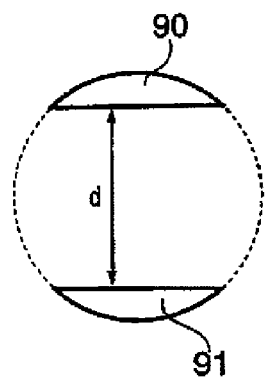
FIG. 9A is a sectional view taken along a line C-C' of the fluid mixing portion of FIG. 7A.
Figure 9B:
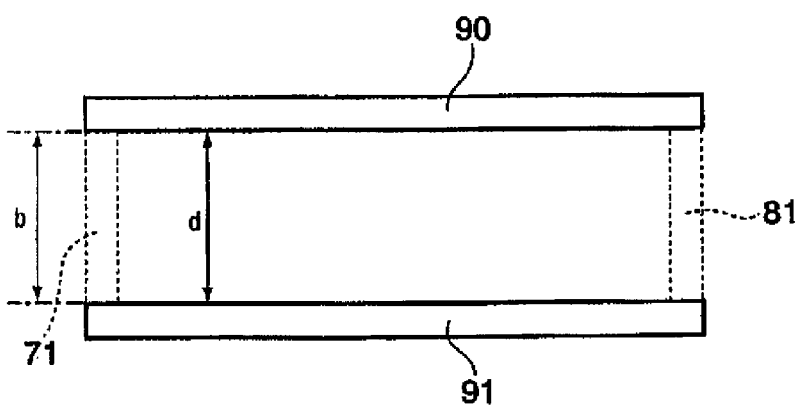
FIG. 9B is a sectional view on a plane D.

Further, FIG. 9A is a sectional view taken along line C-C' of the fluid mixing portion of FIG. 7A, and FIG. 9B is a sectional view on a plane D.

The disk-shaped first mixing nozzle 70 provided with the substantially rectangular shaped first ejecting port 71 and the disk-shaped second mixing nozzle 80 provided with the substantially rectangular shaped second ejecting port 81 in the same way are connected by being bridged by the pair of partition plates (90, 91).

The space between the first ejecting port 71 and the second ejecting port 81 becomes the mixing region MR for mixing the first jet flow of the first fluid and the second jet flow of the second fluid.

The first mixing nozzle 70, second mixing nozzle 80, and the pair of partition plates (90, 91) are for example integrally formed. For example, they are formed from a brass, stainless steel, or other material by using an NC wire cut electrodischarge machining apparatus. Alternatively, for example the parts may be individually formed and assembled.

The shapes of the first ejecting port 71 and second ejecting port 81 are for example a length a of the short side of up to about several millimeters and length b of the long side of several to ten odd millimeters. The aspect ratio (b/a) of the length a of the short side and the length b of the long-side is preferably 4 to 6.

Further, the inter-nozzle distance c between the first ejecting port 71 of the first mixing nozzle 70 and the second ejecting port 81 of the second mixing nozzle 80 is preferably a distance 4 to 35 times the length of the short side a of the substantially rectangular shape of the first ejecting port 71 and second ejecting port 81.

For example, the length a of the short side of the substantially rectangular shape of the first ejecting port 71 and second ejecting port 81 is about 1 mm, the length b of the long side is about 4 nm, the aspect ratio (b/a) is 4, and the inter-nozzle distance is 16 mm.

Further, a distance d between the pair of partition plates (90, 91) is set substantially equal to the length b of the long side of the substantially rectangular shape of the first ejecting port 71 and second ejecting port 81.

Figure 10:
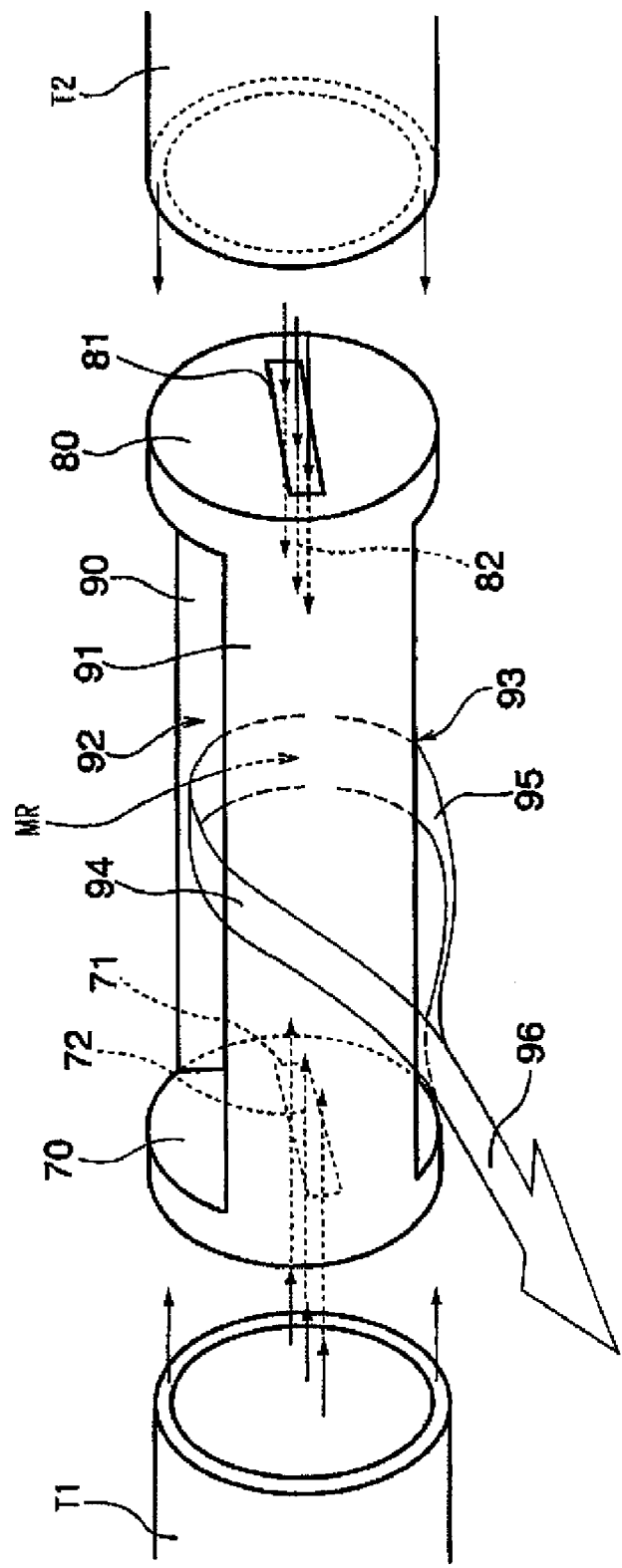
FIG. 10 is a schematic view showing a state of mixing fluids by using the fluid mixing portion shown in FIG. 7A.

FIG. 10 is a schematic view showing the state of using the fluid mixing portion shown in FIG. 7A to mix the fluids.

For example, a first fluid supply pipe T1 is connected to the surface of the first mixing nozzle 70 on the opposite side from the mixing region MR, while a second fluid supply pipe T2 is connected to the surface of the second mixing nozzle 80 on the opposite side from the mixing region MR.

Here, the first fluid including the first nano particles is supplied from the first fluid supply pipe T1, and the second fluid including the second nano particles is supplied from the second fluid supply pipe T2. The first fluid becomes the first jet flow 72 and is ejected from the first ejecting port 71 to the mixing region MR, while the second fluid becomes the second jet flow 82 and is ejected from the second ejecting port 81 to the mixing region MR. The first fluid and the second fluid are mixed in the mixing region MR by the oscillation phenomenon of the coaxially facing colliding jet flows.

The mixed fluids (94, 95) flow out from the openings (92, 93) facing the mixing region MR to the outside of the mixing region MR and further flow as for example the merged fluid 96 to the supersonic nozzle.

Here, as the pressures of the fluids supplied by the first fluid supply pipe T1 and the second fluid supply pipe T2 and the pressure of the mixing region before ejecting the fluids, for example the pressures of fluids supplied by the first fluid supply pipe T1 and the second fluid supply pipe T2 are made 60 to 90 kPa and the pressure of the mixing region before ejecting the fluids is made 0.5 to 2 kPa. The pressure ratio upstream and downstream of the ejecting port is set at for example about 45.

The state of mixing of the first fluid and second fluid described above can be confirmed by observing for example the oscillation of the pressure in the mixing region of the fluid mixing portion.

Further, in the SFJ-PVD system according to the present embodiment, the state of mixing of the first fluid and second fluid can be confirmed by mixing and depositing different types of nano particles obtained from the evaporation sources and measuring the uniformity of the formed vapor deposited film.

The SFJ-PVD system according to the present embodiment described above uses, as the plasma torch of the evaporation chamber, a polymer-based or non-polymer-based insulation pipe generating less outgas than that by BAKELITE® phenol resin in order to insulate the plasma tip and the electrode. Since it does not use BAKELITE® phenol resin, it can be used while generating less outgas even in an ultra-high vacuum environment and can deposit microparticles having less contaminated active surfaces so as to form a dense film.

Further, as the fluid mixing portion for mixing the first microparticles and second microparticles, it is possible to utilize the oscillation phenomenon of coaxially facing colliding jet flows to uniformly mix the particles without using electricity or other energy from the outside and without using any mechanical moving parts and thereby form a film having a uniform quality.

For example, by setting Ti as the first evaporation source in the first evaporation chanter and setting Al as the second evaporation source in the second evaporation chamber, a TiAl film can be formed on the substrate for film formation of the film formation chamber.

Further, by setting for example the evaporation source in the same way as that described above and further running nitrogen as the atmospheric gas in each of the first and second evaporation chambers, a Ti—Al—N film can be formed.

Other than this, even a film difficult to form by mixing a composition by the usual method, for example metals and ceramics, can be densely formed by freely controlling the composition.

Second Embodiment

Figure 11A:
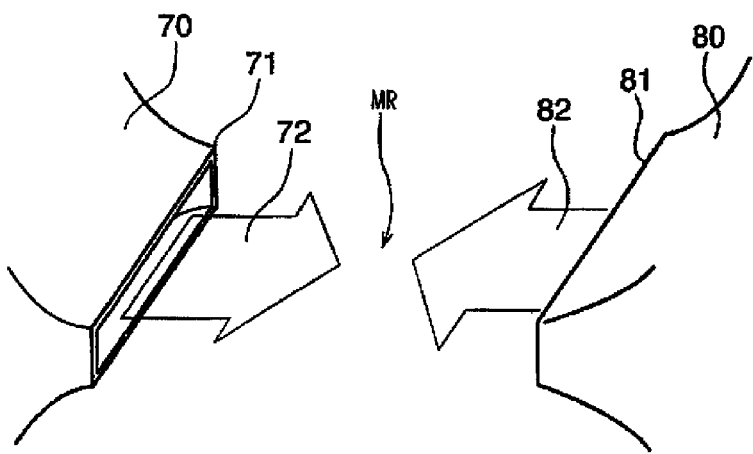
FIG. 11A is a schematic view of the configuration of a fluid mixing portion of a physical vapor deposition system according to a second embodiment.
Figure 11B:
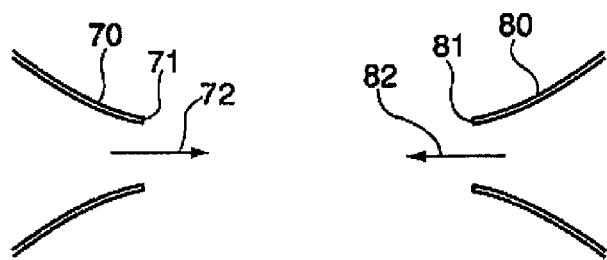
FIG. 11B is a schematic sectional view.

FIG. 11A is a schematic view of the configuration of the fluid mixing portion of the physical vapor deposition system according to the present embodiment, and FIG. 11B is a schematic sectional view.

The first mixing nozzle 70 and the second mixing nozzle 80 have parts forming taper shapes where sizes of spaces through which the first fluid and second fluid flow toward the first ejecting port 71 and second ejecting port 81 become larger the further to the upstream side far from the first ejecting port 71 and second ejecting port 81 than the downstream side near the first ejecting port 71 and second ejecting port 81 in the vicinities of the first ejecting port 71 and second ejecting port 81. The rest of the configuration is similar to that of the physical vapor deposition system according to the first embodiment.

In the physical vapor deposition system having the fluid mixing portion according to the present embodiment, jet flow speeds of the first jet flow 12 and the second jet flow 22 ejected from the first mixing nozzle 10 and the second mixing nozzle 20 are raised, the first fluid and second fluid can be more uniformly mixed, and a film having a further uniform film quality can be formed.

Third Embodiment

Figure 12:
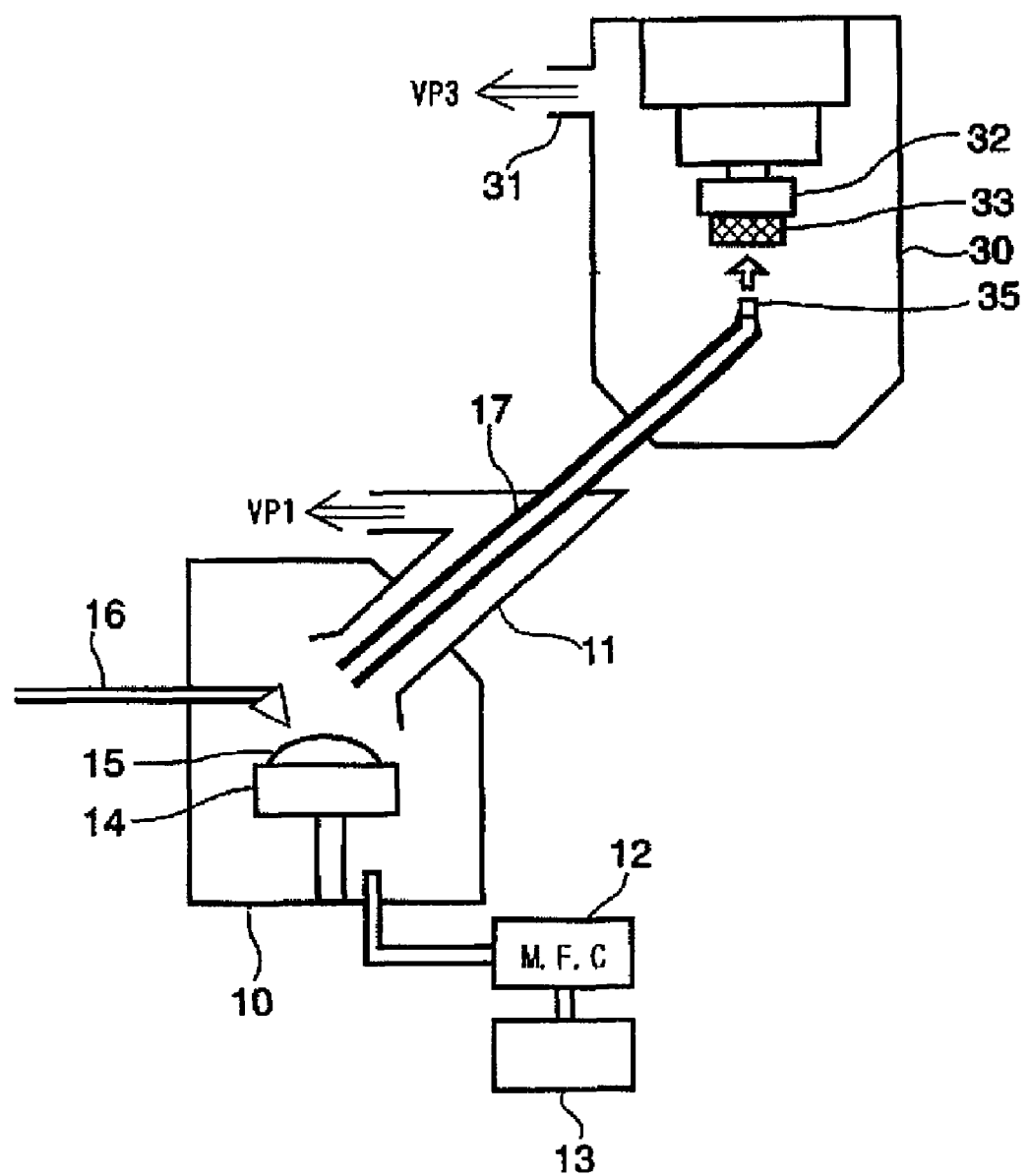
FIG. 12 is a schematic view of the configuration of a physical vapor deposition system according to a third embodiment of the present invention.

FIG. 12 is a schematic view of the configuration of an SFJ-PVD system according to the present embodiment.

This is substantially the same as the SFJ-PVD system according to the first embodiment, but only one evaporation chamber is provided as the evaporation chamber. Namely, provision is made of an evaporation chamber 10 and a vacuum chamber for the film formation constituted by an evaporation chamber 30.

The evaporation chamber 10 is provided with an exhaust pipe 11 connected to a vacuum pump VP1. The vacuum pump VP1 operates evacuate the interior of the evaporation chamber 10 to an ultra-high vacuum atmosphere of for example about $10^{-10}$ Torr. Further, a gas supply source 13 provided in the evaporation chamber 10 via a mass flow controller 12 supplies according to a need an atmosphere gas such as He or $N_2$ into the evaporation chamber 10 with the predetermined flow rate.

The film formation chamber 10 is provided with a water cooled copper crucible 14. An evaporation source material 15 is placed in this. A plasma torch 16 is provided in the vicinity of the evaporation source material 15. Using the plasma gas generated by the discharge between the plasma tip forming part of the plasma torch 16 and the internal electrode as a medium, the evaporation source material 15 is heated and evaporated by the non-transfer method, and microparticles having sizes of the nanometer order (nano particles) are obtained from atoms evaporated from the evaporation source material 15.

The obtained nano particles are transferred to the film formation chamber 30 through the transfer pipe 17 together with the atmospheric gas in the evaporation chamber 10.

The film formation chamber 30 is provided with an exhaust pipe 31 connected to a vacuum pump VP3. The vacuum pump VP3 operates to evacuate the interior of the film formation chamber 30 to an ultra-high vacuum atmosphere of for example about $10^{-10}$ Torr.

The film formation chamber 30 is provided with a stage 32 driven in the X-Y direction. The stage 32 has a substrate for film formation 33 is fixed to it.

A supersonic nozzle (Laval nozzle) 35 is provided on the front end of the transfer pipe 17 from the evaporation chamber 10. On the outer circumference of the supersonic nozzle 35 side of the transfer pipe 17, a not shown coil heater may be provided to enable the heating.

When nano particles are generated in the above evaporation chamber 10, the flow of the gas occurs due to the pressure difference between the evaporation chamber 10 and the film formation chamber 30, and nano particles are transferred to the film formation chamber 30 through the transfer pipe together with the atmospheric gas.

The fluid including nano particles is ejected from the supersonic nozzle (Laval nozzle) 35 as a supersonic gas flow (stream of supersonic free jet) into the film formation chamber 30 toward the substrate for film formation 33.

The supersonic nozzle 35 is a reducing-expanding pipe having a changing nozzle inside diameter and can raise the gas flow induced due to the pressure difference between the evaporation chamber and the film formation chamber up to the supersonic speed of for example Mach 1.2 or more.

Nano particles are accelerated up to the supersonic speed of about Mach 3.6 by the supersonic nozzle 35, ride on the supersonic gas flow to be ejected into the film formation chamber 30, and are deposited (by physical vapor deposition) onto the substrate for film formation 33.

In the SFJ-PVD system according to the present embodiment, in the same way as the first embodiment, the plasma torch of the evaporation system uses a polymer-based or non-polymer-based insulation pipe generating less outgas than that by BAKELITE® phenol resin in order to insulate the plasma tip and the electrode. Since it does not use BAKELITE® phenol resin, it can be used while generating less outgas even under an ultra-high vacuum environment. By depositing microparticles having less contaminated active surfaces, a dense film can be formed.

In SFJ-PVD systems according to the embodiments described above, a heating means for heating the gas including microparticles passing through the inside of the supersonic nozzle and/or transfer pipe may be provided in the supersonic nozzle and/or transfer pipe per se or on the outer circumference of the supersonic nozzle and/or transfer pipe.

Further, at least a portion of the supersonic nozzle and the above transfer pipe may be made of quartz, and the RF coil for changing the gas including microparticles passing through the inside the supersonic nozzle and/or transfer pipe to plasma may be provided on the outer circumference of the supersonic nozzle and/or transfer pipe.

When employing the above constitutions, the film formation can be more precisely controlled.

The present invention is not limited to the above explanation.

For example, in the plasma torches of the embodiments described above, the holding pipe arranged at the outer circumference of the anode is comprised of first to third holding members integrally formed while being insulated from each other via insulation members, but the invention is not limited to this. It is also possible to enable the application of predetermined potentials to the anode and the cathode, realize a cooling system or gas supplying system, and configure the anode and cathode to handle a ultra-high vacuum environment without using BAKELITE® phenol resin.

Further, for example, in the fluid mixing portion, a pair of partition plates for preventing the dispersion of the first fluid and second fluid in the long side direction of the substantially rectangular shape of each ejecting port from the mixing region are preferably provided, but they do not always have to be provided.

In addition, various modifications are possible within the range not out of the gist of the present invention.

INDUSTRIAL CAPABILITY

The physical vapor deposition system of the present invention can be applied to the method of forming a high density coating film having a film thickness of for example about several tens to several hundreds of micrometers at a low temperature.

The invention claimed is:
1. A physical vapor deposition system comprising:
an evaporation chamber comprising an evaporation source and a plasma torch inside the evaporation chamber, using plasma generated by said plasma torch under a predetermined gas atmosphere or the ambient air atmosphere to heat and evaporate said evaporation source, and generating microparticles from the evaporated atoms and
a film formation chamber provided with a supersonic nozzle inside the film formation chamber, the supersonic nozzle being connected to a transfer pipe acting as a route for conveying a gas including said microparticles from said evaporation chamber and a substrate for film formation, making said microparticles transferred from said evaporation chamber ride on a supersonic gas flow created by said supersonic nozzle, and making said microparticles deposit on said substrate for film formation by physical vapor deposition,
said plasma torch having
a cylindrical conductive anode,
a polymer-based or non-polymer-based insulation pipe inserted inside said anode and generating less outgas than that by phenol resin,
a rod shaped cathode inserted inside said insulation pipe so as not to contact said anode, and
a holding pipe arranged at an outer circumference of said anode,
said holding pipe having a first holding member electrically connected to said cathode and mechanically holding said cathode, a second holding member electrically connected to said anode and mechanically holding said cathode, and a third holding member for mechanically holding said anode and said cathode via said first holding member and said second holding member, at least said first holding member and second holding member and said second holding member and third holding member being joined by welding to an insulation member of ceramic, said first holding member, said second holding member, and said third holding member being integrally formed while insulated from each other,
a ultra high vacuum joint or international conflat flange, or both, said ultra high vacuum joint, international conflat flange, or both, being used as a vacuum seal of said anode, said cathode, and said holding pipe, and
a negative voltage being applied to said cathode and a positive voltage being applied to said anode or said evaporation source, or both, to thereby to form plasma.
2. A physical vapor deposition system comprising:
a first evaporation chamber provided with a first evaporation source and a first plasma torch inside the first evaporation chamber, using plasma generated by said first plasma torch under a predetermined gas atmosphere or the ambient air atmosphere to heat and evaporate said first evaporation source, and generating first microparticles from the evaporated atoms,
a second evaporation chamber provided with a second evaporation source and a second plasma torch inside the second evaporation chamber, using plasma generated by said second plasma torch under a predetermined gas atmosphere or the ambient air atmosphere to heat and evaporate said second evaporation source, and generating second microparticles from the evaporated atoms, and
a film formation chamber provided with a fluid mixing portion and a supersonic nozzle inside the film formation chamber, the fluid mixing portion and the supersonic nozzle being connected to a transfer pipe acting as the route for conveying the gas including said microparticles from said evaporation chambers and a substrate for film formation, mixing said first microparticles transferred from said first evaporation chamber and said second microparticles transferred from said second evaporation chamber by said fluid mixing portion, making the mixed first microparticles and second microparticles ride on the supersonic gas flow created by said supersonic nozzle, and depositing said mixed first microparticles and second microparticles onto said substrate for film formation by physical vapor deposition,
each of said first plasma torch and second plasma torch having
a cylindrical conductive anode,
a polymer-based or non-polymer-based insulation pipe inserted inside said anode and generating less outgas than that by phenol resin, and
a rod shaped cathode inserted inside said insulation pipe so as not to contact said anode, a negative voltage being applied to said cathode and a positive voltage being applied to one or more of said anode, said first evaporation source, or said second evaporation source to form plasma, and said fluid mixing portion having a first mixing nozzle having a rectangular shaped first ejecting port a second mixing nozzle having a second ejecting port having the same shape as that of said first ejecting port and provided coaxially facing said first mixing nozzle, and a pair of partition plates arranged in a long side direction of said rectangular shape so as to face each other sandwiching between them the space between said first ejecting port and said second ejecting port and preventing said first fluid and said second fluid from dispersing in the long side direction of said rectangular shape, ejecting the first fluid including said first microparticles from the first ejecting port, ejecting the second fluid including said second microparticles from said second ejecting port, and mixing said first fluid and said second fluid in a space between said first ejecting port and said second ejecting port.

3. A physical vapor deposition system as set forth in claim 2, wherein, in said fluid mixing portion, an aspect ratio (b/a) of a length a of a short side and a length b of a long side of said rectangular shape of said first ejecting port and said second ejecting port is 4 to 6.

4. A physical vapor deposition system as set forth in claim 2, wherein, in said fluid mixing portion, an inter-nozzle distance between said first mixing nozzle and said second mixing nozzle is a distance 4 to 35 times the length of the short side of said rectangular shape.

5. A physical vapor deposition system as set forth in claim 2, wherein, in said fluid mixing portion, said first mixing nozzle has a part forming a taper shape where a size of a space through which said first fluid flows toward said first ejecting port becomes larger the further to the upstream side far from said first ejecting port than the downstream side near said first ejecting port in the vicinity of said first ejecting port, and said second mixing nozzle has a part forming a taper shape where a size of a space through which said second fluid flows toward said second ejecting port becomes larger the further to the upstream side far from said second ejecting port than the downstream side near said second ejecting port in the vicinity of said second ejecting port.

6. A physical vapor deposition system as set forth in claim 2, wherein, in said fluid mixing portion, the distance between said pair of partition plates is equal with the length of the long side of said rectangular shape.

7. A physical vapor deposition system as set forth in claim 2, wherein, in at least one of said first plasma torch or said second plasma torch, a plasma gas distributor made of ceramic for positioning the relative positions of said anode and said cathode and ensuring that the plasma gas supplied to said cathode is equally distributed is provided in the vicinity of the front end of said cathode and between said anode and said cathode.

8. A physical vapor deposition system as set forth in claim 2, wherein, in at least one of said first plasma torch or said second plasma torch, said cathode has internal structure comprised of a three-layer structure of a first hollow portion arranged at the center, a second hollow portion arranged on the outer circumference of said first hollow portion, and a third hollow portion arranged on the outer circumference of said second hollow portion.

9. A physical vapor deposition system as set forth in claim 8, wherein, in at least one of said first plasma torch or said second plasma torch, said first hollow portion of said cathode is a plasma gas supply pipe.

10. A physical vapor deposition system as set forth in claim 8, wherein, in at least one of said first plasma torch or said second plasma torch, said second hollow portion of said cathode is an inlet pipe of a coolant, and said third hollow portion of said cathode is an outlet pipe of said coolant.

11. A physical vapor deposition system as set forth in claim 2, wherein, in at least of said first plasma torch or said second plasma torch, said anode has a built-in cooling pipe.

12. A physical vapor deposition system as set forth in claim 2, wherein, in at least one of said first plasma torch or said second plasma torch, at least one of a ultra high vacuum joint or international conflat flange is used as a vacuum seal.

13. A physical vapor deposition system as set forth in claim 2, wherein, in at least one of said first plasma torch or said second plasma torch, a system applying a positive voltage and a negative voltage to said anode and said cathode respectively to form the plasma and a system applying a positive voltage and a negative voltage to said first or second evaporation source to be heated and said cathode respectively to form the plasma may be switched between or used together.

14. A physical vapor deposition system comprising:

a first evaporation chamber provided with a first evaporation source and a first plasma torch inside the first evaporation chamber, using plasma generated by said first plasma torch under a predetermined gas atmosphere or the ambient air atmosphere to heat and evaporate said first evaporation source, and generating first microparticles from the evaporated atoms, a second evaporation chamber provided with a second evaporation source and a second plasma torch inside the second evaporation chamber, using plasma generated by said second plasma torch under a predetermined gas atmosphere or the ambient air atmosphere to heat and evaporate said second evaporation source, and generating second microparticles from the evaporated atoms, and a film formation chamber provided with a fluid mixing portion and a supersonic nozzle inside the film formation chamber, the fluid mixing portion and the supersonic nozzle being connected to a transfer pipe acting as the route for conveying the gas including said microparticles from said evaporation chambers and a substrate for film formation, mixing said first microparticles transferred from said first evaporation chamber and said second microparticles transferred from said second evaporation chamber by said fluid mixing portion, making the mixed first microparticles and second microparticles ride on the supersonic gas flow created by said supersonic nozzle, and depositing said mixed first microparticles and second microparticles onto said substrate for film formation by physical vapor deposition, each of said first plasma torch and second plasma torch having a cylindrical conductive anode, a polymer-based or non-polymer-based insulation pipe inserted inside said anode and generating less outgas than that by phenol resin, a rod shaped cathode inserted inside said insulation pipe so as not to contact said anode, and a holding pipe arranged at an outer circumference of said anode, said holding pipe having a first holding member electrically connected to said cathode and mechanically holding said cathode, a second holding member electrically connected to said anode and mechanically holding said cathode, and a third holding member for mechanically holding said anode and said cathode via said first holding member and said second holding member, at least said first holding member and second holding member and said second holding member and third holding member being joined by welding to an insulation member of ceramic, said first holding member, said second holding member, and said third holding member being integrally formed while insulated from each other, at least one of a ultra high vacuum joint or international conflat flange being used as a vacuum seal of said anode, said cathode, and said holding pipe, a negative voltage being applied to said cathode and a positive voltage being applied to at least one of said anode, said first evaporation source, or said second evaporation source to thereby to form plasma, and said fluid mixing portion having a first mixing nozzle having a rectangular shaped first ejecting port and a second mixing nozzle having a second ejecting port having the same shape as that of said first ejecting port and provided coaxially facing said first mixing nozzle, ejecting the first fluid including said first microparticles from the first ejecting port, ejecting the second fluid including said second microparticles from said second ejecting port, and mixing said first fluid and said second fluid in a space between said first ejecting port and said second ejecting port.

* * * * *